United States Patent

Mori et al.

[11] Patent Number: 5,906,429
[45] Date of Patent: *May 25, 1999

[54] OPTICAL ILLUMINATION DEVICE

[75] Inventors: Takashi Mori; Jin Yamada; Jun Nagatsuka, all of Kanagawa-ken; Shinichi Hasegawa, Saitama-ken; Shigeru Hagiwara, Kanagawa-ken, all of Japan

[73] Assignee: Nikon Corporation, Tokyo, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/900,880

[22] Filed: Jul. 25, 1997

Related U.S. Application Data

[63] Continuation of application No. 08/457,749, Jun. 1, 1995, abandoned, which is a continuation of application No. 08/270,774, Jul. 5, 1994, abandoned.

[30] Foreign Application Priority Data

Sep. 2, 1993 [JP] Japan ..................................... 5-218278

[51] Int. Cl.⁶ ..................................................... F21V 9/00
[52] U.S. Cl. ........................... 362/293; 362/96; 362/264; 362/294; 362/345; 95/137; 95/141; 96/142; 250/492.2
[58] Field of Search .............................. 362/96, 268, 293, 362/294, 264, 345, 373; 95/128, 135–137, 141; 96/117, 127, 134, 142; 250/492.2; 359/884

[56] References Cited

U.S. PATENT DOCUMENTS

| | | | |
|---|---|---|---|
| 3,988,129 | 10/1976 | Fornoff et al. | 95/137 |
| 4,684,510 | 8/1987 | Harkins | 95/136 |
| 4,734,835 | 3/1988 | Vines et al. | 362/264 |
| 4,758,250 | 7/1988 | Laciack et al. | 95/128 |
| 5,130,904 | 7/1992 | Ohshio et al. | 362/293 |
| 5,166,530 | 11/1992 | McCleary | 250/492.2 |
| 5,168,302 | 12/1992 | Watanuki | 362/96 |
| 5,169,224 | 12/1992 | Segoshi et al. | 362/263 |
| 5,207,505 | 5/1993 | Naraki et al. | 362/373 |
| 5,298,939 | 3/1994 | Swanson et al. | 355/53 |
| 5,430,303 | 7/1995 | Matsumoto et al. | 250/492.2 |

FOREIGN PATENT DOCUMENTS

| | | |
|---|---|---|
| 4-139453 | 5/1992 | Japan . |
| 6-202243 | 7/1994 | Japan . |

*Primary Examiner*—Alan Cariaso
*Attorney, Agent, or Firm*—Armstrong, Westerman, Hattori, McLeland & Naughton

[57] ABSTRACT

An optical illumination device reflects and condenses light from a mercury-arc lamp by a light reflecting and condensing member and then reflects and deflects the light, thereafter the reflected and deflected light is transferred to a relay-lens system through a collimator lens or input lens, band-pass filter and fly-eye lens. Gas from which impurities are removed by a filter is flown around optical elements to separate the optical elements from air containing material causing clouding of the optical elements to thereby restrain clouding of the optical elements. On the other hand, or in addition, the reflectance of the light reflecting and condensing member and/or miller for the light of the absorption band of sulfur dioxide is made small to prevent the optical elements from clouding.

42 Claims, 13 Drawing Sheets

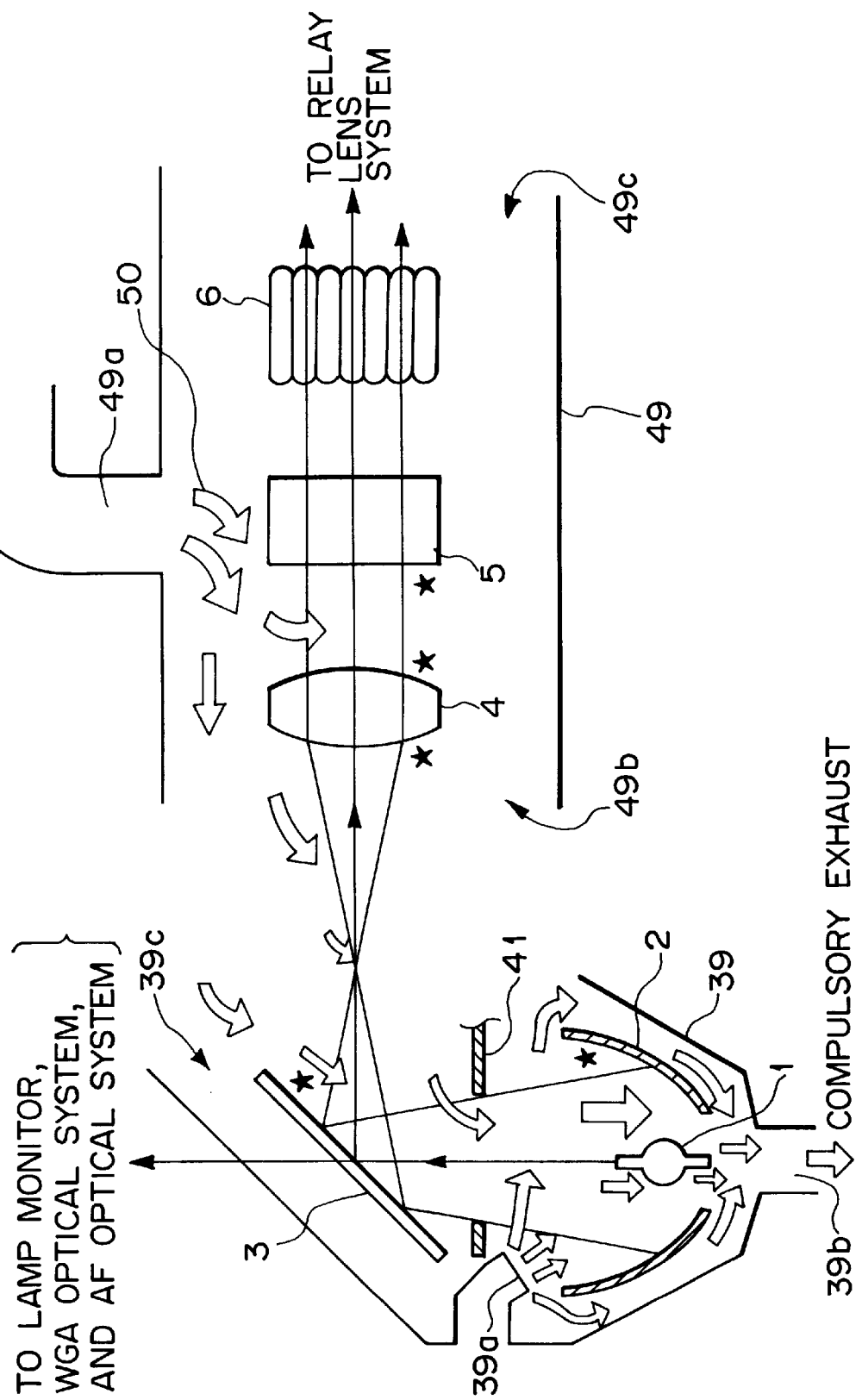

Fig. 13(a) 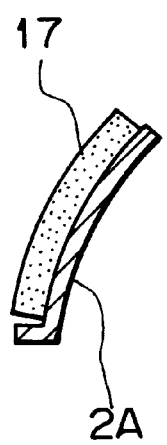 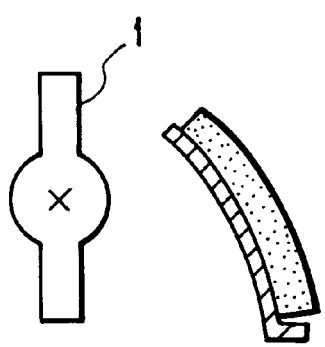

OPTICAL ILLUMINATION DEVICE

This application is a continuation of application Ser. No. 08/457,749 filed Jun. 1, 1995, now abandoned, which is a continuation of application Ser. No. 08/270,774 filed Jul. 5, 1994, now abandoned.

BACKGROUND OF THE INVENTION

1. Field of the Invention

The present invention relates to an optical illumination device for illuminating objects by light from a discharge lamp such as a mercury-arc lamp, and, more particularly, to a device suited for use in the optical illumination system of an exposure apparatus for manufacturing semiconductors.

2. Description of the Prior Art

Devices for illuminating objects using light from discharge lamps have been used in various fields in various applications. In reduction projection type exposure apparatus (steppers, aligners, etc.) used in photolithography for manufacturing LSI chips and other semiconductor or liquid crystal display elements, a device is used for illuminating reticles on which patterns for transfer are formed with a light beam of specified wavelengths (e.g., the i-line of a wavelength of 365 nm or the g-line of a wavelength of 436 nm) among the light radiated from an extra-high-pressure mercury-arc lamp (Hg lamp, Xe-Hg lamp, etc.).

In such projection exposure apparatus, however, efforts are continuing to transfer finer patterns at higher resolution to photosensitive substrates. In general, the resolution, R, and the depth of focus, DOF, of a projection exposure apparatus are expressed by the following equations:

$$R = k_1 \cdot \lambda / NA \quad (1)$$

$$DOF = k_2 \cdot \lambda / NA^2 \quad (2)$$

where NA is the numerical aperture of the projection optical system in the projection exposure apparatus, $\lambda$ is the wavelength of light for exposure, and $k_1$ and $k_2$ are factors each decided by the process. It will be understood from the above equations that the finesse of the pattern is achieved by either one of the following methods:

(1) Increasing the numerical aperture (NA) of the projection optical system (2) Decreasing the wavelength of the light for exposure (exposure wavelength)$\lambda$.

Of the two methods, projection optical systems with an NA of 0.5 to 0.6 or larger have recently been developed and resolution has been improved significantly. However, if the NA of a projection optical system is merely increased, as equation (2) shows, the DOF will decrease in inverse proportion to the square of the NA. In actual semiconductor manufacturing processes, in general, since circuit patterns must be projected onto a wafer having different levels produced in the preceding step and the flatness error of the wafer itself must also be absorbed, the DOF must be sufficiently large.

On the other hand, in the method of decreasing the exposure wavelength ($\lambda$), as equation (2) shows, the DOF varies in proportion to the wavelength of exposure light. Therefore improving resolution R by decreasing the wavelength $\lambda$ of exposure light (as in the above method (2)) is more advantageous than improving resolution R by increasing the numerical aperture NR (as in the above method (1)) from the point of view of securing a large DOF. For these reasons, the bright-line called an i-line (a wavelength of 365 nm) emitted from a mercury-arc lamp is used more frequently in recent years than the conventionally used bright-line called a g-line (a wavelength of 436 nm) emitted from the same mercury-arc lamp.

FIG. 1 shows an example of a prior-art optical illumination device using a mercury-arc lamp as its light source used in a projection exposure apparatus. In FIG. 1, the luminescent point of a mercury-arc lamp 1 is located on the first focal point, F1, in a light reflecting and condensing member or elliptical mirror 2. On the top of the elliptical mirror 2 is formed an opening through which the electrode of the mercury-arc lamp 1 passes and, on the internal surface of the elliptical mirror 2, are vapor-deposited aluminum or various multilayer dielectric materials, thus causing the internal surface to function as a reflector. Light L emitted from the mercury-arc lamp 1 is reflected by the internal surface of the elliptical mirror 2 toward a mirror 3 for deflecting the optical path. Aluminum or various multilayer dielectric materials are also vapor-deposited on the reflecting surface of the mirror 3. Light reflected from the mirror 3 is collected on a second focal point, F2, of the elliptical mirror 2, thereby forming a light source image on the second focal point.

Divergent light from the light source image is converted to substantially parallel luminous flux by a collimator lens or input lens 4 and impinges on a narrow band-pass filter 5. The illuminating light of a wavelength selected by the band-pass filter 5 impinges on a fly-eye lens 6, which functions as an optical integrator, and many secondary light sources are formed on the focal plane behind the fly-eye lens 6 (on the reticle side). Divergent light from these many secondary light sources is reflected by a mirror 7 for deflecting the light path, converged by the condenser lens 8, and illuminates the pattern-formation surface of the reticle 9 on the surface to be illuminated so that light beams overlap. Aluminum or various multilayer dielectric materials are vapor-deposited on the reflecting surface of the mirror 7.

The entire optical system is compactly constructed by the use of mirrors 3 and 7 for deflecting the light path. The internal surface of the elliptical mirror 2 functioning as a convergent mirror, and the reflecting surfaces of the mirrors 3 and 7 are designed so that the reflectance of exposure light of a selected wavelength is maximized.

A super-high-pressure mercury-arc lamp is used as the mercury-arc lamp 1 in FIG. 1. The emission spectrum distribution of this super-high-pressure mercury-arc lamp is shown in FIG. 2. The wavelength dependence of the reflectance of the aluminum reflecting mirror having an aluminum vapor-deposited surface is shown in FIG. 3(a), and the wavelength dependence of the reflectance of a typical conventional dielectric multilayer reflecting mirror having a reflection surface on which multilayer dielectric materials are vapor-deposited is shown in FIG. 3(b). The wavelength dependence of transmissivity of the band-pass filter 5 in FIG. 1 when the exposure light is the i-line (a wavelength of 365 nm) is shown in FIG. 4. By such a structure, the i-line illumination light is selected, the pattern of a reticle 9 is illuminated by uniform illumination distribution, and the pattern of the reticle 9 is imaged through a projection optical system (not shown) onto the photosensitive substrate.

When a conventional optical illumination device as described above is operated under a condition open to the exterior, the surfaces of optical members (the elliptical mirror 2, the mirror 3, the collimator or input lens 4, and the band-pass filter 5 in FIG. 1) from the mercury-arc lamp 1 to the band-pass filter 5 are clouded, and reflectance and transmissivity gradually decrease, lowering illumination efficiency. This clouding phenomenon is known to be caused when clouding substances adhere to optical elements. The results of analysis using ion chromatography showed that the major substance causing clouding is ammonium sulfate $((NH_4)_2SO_4)$.

The results of analysis using ESCA and SEM (scanning electron microscopy) showed that silicon oxides $(SiO_x)$ had also occasionally adhered to the surface of mirrors and lenses. If silicon oxides have adhered, scattering occurs if the surface is not smooth. Even if the surface is smooth, when silicon oxides have adhered to antireflection and high-reflection coating, the antireflection and reflection coatings are out of an optimum condition, and transmissivity or reflectance decreases, consequently lowering illumination. These clouding substances are considered to be ammonium ions $(NH_4^+)$, sulfate ions $(SO_4^{2-})$, or organic silanol photochemically deposited optical elements where far ultraviolet (UV) rays impinge.

These ions or molecules of compounds have been considered to be those formed from the surface of materials such as black alumite (BAm) widely used in support or shield elements in illuminating optical systems, those originally existing in air, or those ionized by the irradiation of UV light. Since a diazo dye is used in BAm and sulfuric acid is used in the BAm process, BAm may be the sources of ammonium and sulfate groups, which are the constituents of ammonium sulfate. When UV light was irradiated onto a black alumite material in a nitrogen $(N_2)$ environment, oxygen $(O_2)$ environment, and normal atmospheric environment containing a large amount of water vapor, and the contamination of the optical element was compared, the largest amounts of ammonium groups and sulfate groups were formed in air containing water vapor, and the second largest amounts of these ions were formed in the $(O_2)$ environment. This proved that the possibility of accelerated contamination was heightened by the presence of water in air.

The irradiation of UV light to $O_2$ is considered to cause $O_2$ to be converted to ozone, which accelerates the formation of ions from the wall of the support element and the ionization of gases in air. However, the source of silicon oxides could not be found in the optical illumination system. When the dependence on the installation environment of the device was investigated, the presence of large amounts of ionic substances such as ammonium group, sulfate group, and nitrate group was found in a clean room, and, the presence of organic silanes such as hexamethyl disiloxane (HMDS) and trimethyl silanol was found. HMDS is a material widely used as a surface-treatment agent in applying photosensitive materials to wafers, and trimethyl silanol is formed when HMDS hydrolyzes. Investigation results showed a very close relationship between the amount of substances clouding optical elements and the amount of the above impurities. A detailed study on contamination showed that the source of clouding substances is present in the environment where the device is installed, but not in the device itself.

In filtering air passing through optical devices, a high-efficiency particulate air (HEPA) filter has conventionally been used. However, since the HEPA filter is for removing particles, it cannot remove ions or impurities which cause the photochemical reaction as described above.

As a method of avoiding the adherence of ammonium sulfate $((NH_4)_2SO_4)$, U.S. Pat. No. 5,207,505 to the applicant of the present invention discloses a method for maintaining the optical device at a temperature of 120° C. or more because the decomposition of ammonium sulfate begins at about 120° C. (*Kagaku Daijiten* Vol. 9, p. 690, published by Kyoritsu Shuppan in 1964). However, although the light condensation mirrors, which are near the mercury-arc lamp, a large "heat source," can be maintained at a high temperature relatively easily, other optical elements require a considerably large separate heat source, and the dissipation of heat is very important in a semiconductor exposure apparatus which requires strict temperature control.

A prior-art device for preventing the clouding of optical elements (elliptic and direction-changing mirrors) by accommodating the light source and such optical elements in a container and introducing ion-particleless gas in this container is disclosed in Japanese Laid-Open Publication No. 4-139453. However, the device disclosed in this publication prevents only the formation of ammonium sulfate in the above optical elements. Furthermore, invention shown in this publication does not intend to prevent ammonium sulfate formation in optical elements disposed downstream side from the direction-changing mirror.

Meanwhile, the inventors of the present invention also examined the process in which ammonium sulfate $((NH_4)_2SO_4)$ is formed from substances present in air in minute quantities. Results showed that a photochemical reaction in which light of a wavelength less than 5 nm is involved is assumed in an optical illumination device of prior art using the i-line (a wavelength of 365 nm) of a mercury-arc lamp shown in FIG. 1, because the adhesion of white ammonium sulfate powder is limited to within the area between the elliptical mirror 2 and the surface of the band-pass filter plate 5 on which light impinges.

Sulfur dioxide $(SO_2)$ and ammonia $(NH_3)$ are normally present in the air in very small amounts, and this is true also in a clean room in which a semiconductor exposure apparatus is operated. Therefore, the following reaction processes using oxygen $(O_2)$ and water $(H_2O)$ in the air and the energy of UV light are considered.

(1) Sulfur dioxide $(SO_2)$ acquires the energy hv (where h is Planck's constant) of UV light of a frequency v, to form activated sulfur dioxide $(SO_2 \leftrightarrow)$:

$$SO_2 + h\nu \rightarrow SO_2 \leftrightarrow \qquad (i)$$

(2) The activated sulfur dioxide $(SO_2 \leftrightarrow)$ is oxidized as the following formula to form sulfur trioxide $(SO_3)$:

$$2SO_2 \leftrightarrow + O_2 \rightarrow 2SO_3 \qquad (ii)$$

(3) Sulfur trioxide $(SO_3)$ reacts with water as follows to form sulfuric acid $(H_2SO_4)$:

$$SO_3 + H_2O \rightarrow H_2SO_4 \qquad (iii)$$

(4) Ammonia $(NH_3)$ reacts with water as follows to form ammonium hydroxide $(NH_4OH)$:

$$NH_3 + H_2O \rightarrow NH_4OH \qquad (iv)$$

(5) The sulfuric acid $(H_2SO_4)$ formed in formula (iii) reacts with the ammonium hydroxide $(NH_4OH)$ formed in formula (iv) (neutralization) as follows to form ammonium sulfate $((NH_4)_2SO_4)$:

$$H_2SO_4 + 2NH_4OH \rightarrow (NH_4)_2SO_4 + 2H_2O \qquad (v)$$

The above description refers to "Chiba University Environmental Science Research Report," Vol. 1, No. 1, pp. 165–177.

The inventors of the present invention noted that, if the reaction of formula (i) could be inhibited, formation of ammonium sulfate may be prevented. Therefore, if the reflectance of the light reflecting and condensating or converging element or member (2A) for the light having the light absorption band for sulfur dioxide is first decreased, the radiation of light activating sulfur dioxide decreases in subsequent optical elements, and, finally, the amount of ammonium sulfate, which causes white powder or white clouding to form, decreases. Thus, an optical illumination device which maintains a high illumination efficiency even in operation for a long period can be realized.

Next, the absorber of sulfur dioxide is described in detail. According to a different reference (H. Okabe, *Photochemistry of Small Molecules*, p. 248, Wiley-Inter-Science, 1978), sulfur dioxide has four absorption bands corresponding to the following first to fourth excited states:

(1) First excited state: 105–180 nm (2) Second excited state: 180–240 nm (3) Third excited state: 260–340 nm (4) Fourth excited state: 340–390 nm Although the wavelength range of (1) and the wavelength range of (2) are continuous, and, similarly, the wavelength range of (3) and the wavelength range of (4) are continuous, these wavelength ranges or bands are separated because the electron states of excited sulfur dioxide formed by absorbing light of these wavelengths differ from each other. Therefore, if the light reflectance of the light reflecting and condensing or converging element (2A) for the light having at least one of the absorption bands from (1) to (4) is decreased, the radiation of light activating sulfur dioxide decreases in subsequent optical elements, and finally, ammonium sulfate formation, which causes white powder or white clouding to form, decreases.

SUMMARY OF THE INVENTION

It is an object of the present invention to provide an optical illumination device in which the formation of clouding on the surfaces of optical elements is minimized or eliminated.

It is another object of the present invention to provide an optical illumination device in which optical elements are isolated from the environment containing chemical impurities and ions by using an air curtain from which chemical impurities and ions are removed, whereby the formation of clouding is minimized or eliminated without heating optical elements.

It is another object of the present invention to provide an optical illumination device in which the reflectance of the light reflecting and converging or condensing member used in the optical illumination device to light having the absorption band of sulfur dioxide is reduced, thereby minimizing or eliminating clouding without heating optical elements.

It is another object of the present invention to provide an optical illumination device in which the temperature of the reflecting surface of the light reflecting and condensing member used in the optical illumination device is maintained at or above the decomposition temperature of ammonium, and the reflectance of said light reflecting and condensing member to light having the absorption band of sulfur dioxide is reduced, thereby minimizing or eliminating clouding without heating optical elements.

It is still another object of the present invention to provide an optical illumination device in which a light transmission element with a low reflectance to light having the absorption band of sulfur dioxide is arranged nearer the object illuminated than the light reflecting and condensing member used in the optical illumination device, thereby minimizing or eliminating clouding without heating optical elements.

The first optical illumination device according to the present invention comprises a discharge lamp, a member for reflecting and condensing or converging light from said discharge lamp, a wavelength selection element which selectively sends light having the predetermined wavelength band from the light reflected and condensed by said light reflecting and condensing member to the object to be illuminated, and a member for removing at least one of the organosilicon compounds, ammonia, and sulfate ions from the gas passing around all or some of the optical elements arranged in the light path from said discharge lamp to said wavelength selection element.

Substances causing clouding include ammonium ions ($NH_4^+$), sulfate ions ($SO_2^-$), and organic silanols. The present invention intends to directly remove these cloud-causing substances using a clouding-source removing member. As the removing member, an air filter using, for example, a chemical adsorption mechanism, known as a chemical filter, may be used.

In the first optical device, the optical element on which clouding phenomenon appears is provided with an air curtain using air which has passed through the removing member for separating or isolating the optical element from an external environment containing chemical impurities. Substances removed by the removing member include at least one of ammonia, sulfate ions ($SO_4^{2-}$), and organosilicon compounds (e.g., organic silanols) which cause clouding. This decreases the amount of clouding substances adhering to optical elements or members covered by the air curtain. A chemical filter, an example of the removing member, includes those using ion-exchange resins, ion-exchange fibers, an activated charcoal filter whose surface has been chemically treated, or a zeolite filter. For removing organic substances having a high molecular weight, ion-exchange resins and ion-exchange fibers cannot be used because physical adsorption mechanisms are more effective than chemical adsorption mechanisms. For this reason, the use of a composite filter with various structures is effective.

In the embodiments of the present invention, the first optical illumination device may further comprise a member for covering almost the entire light path from the discharge lamp to the wavelength selection element, and a gas supplier which supplies a gas of a higher pressure than the external pressure into the covering member so that the removing member removes at least one of the organosilicon compounds, ammonia, and sulfate ions.

In this optical illumination device, although the gas flow rate is somewhat high, a member covering almost the entire light path is provided for preventing external air from blowing in by supplying chemically purified gas (e.g., air) from, for example, the band-pass filter 5 through the removal element. This allows all surfaces of optical elements in the optical illumination device having the possibility of clouding to come in contact with clean gas, decreasing the formation of clouding substances.

The second optical illumination device according to the present invention comprises a discharge lamp, a member for reflecting and condensing or converging light from said discharge lamp, a wavelength selection element which selectively sends light of the predetermined wavelength band from the light reflected and condensed by said light reflecting and converging member to the object to be illuminated, and a nozzle for blowing a gas from which at least one of the organosilicon compounds, ammonia, and sulfate ions has been removed by a removing member around some of optical elements arranged in the light path from the discharge lamp to the wavelength selection element in order to isolate the above-mentioned optical elements from gas containing impurities.

In the present invention, only optical elements subject to the most heavy clouding are separated and isolated from the environment containing impurity gases with an air curtain in order to use the removing member more efficiently. By this method, since the amount of chemically clean gas used in the air curtain is considerably minimized, a small removing member (chemical filter) may be used. However, unless the gas ejected is carefully laminated, it becomes turbulent and draws in external air, causing the result opposite that desired.

The third optical illumination device according to the present invention comprises a discharge lamp and a member for reflecting and condensing or converging light from said discharge lamp and sending the light to the object to be illuminated. The reflectance of the light reflecting and condensing member to the light having the absorption band of sulfur dioxide has been made small.

In particular, in the present invention, the reflectance of the light reflecting and condensing or converging element to the light having at least one of four wavelength bands of 105–180 nm, 180–240 nm, 260–340 nm, and 340–390 nm has been made small.

When a super-high-pressure mercury-arc lamp is used as the discharge lamp 1, the ultraviolet light of the wavelength band of 260–340 nm is considered to play an important role in the reaction forming ammonium sulfate, because the super-high-pressure mercury lamp emits almost no light of wavelengths of 240 nm or below and, in the prior art example in FIG. 1, no ammonium sulfate formation is empirically observed in optical systems after the band-pass filter 5. Therefore, if the reflectance of the light reflecting and condensing element to the light having the 260–340 nm wavelength band is made 0.5 or below, the ammonium sulfate adherence to subsequent optical elements decreases significantly.

Although ammonium sulfate deposits onto the light reflecting and condensing member, this member is less expensive than subsequent optical elements and is easily replaced. Since the reflecting and converging member is close to the discharge lamp and is heated, no large heat source need be added and a heat reservation device may be used if the temperature of the light reflecting and condensing member is to be maintained above 120° C., which is the decomposition temperature of ammonium sulfate.

A light transmission member may be provided in the light path between the light reflecting and condensing member and the object to be illuminated to reduce the transmissivity of the light transmission member to the light having at least one of four wavelength bands of 105–180 nm, 180–240 nm, 260–340 nm, and 340–390 nm. In this case, since the amount of light irradiation absorbed by sulfur dioxide for subsequent optical elements further decreases, ammonium sulfate deposition may be reduced even further.

Similarly, a reflecting member whose reflectance to light having the wavelength band of 260–340 nm is 0.2 or below, for reflecting and deflecting light from the light reflecting and condensing member may be installed between the light reflecting and condensing member and the object to be illuminated. In this case, also, since the amount of light irradiation absorbed by sulfur dioxide for subsequent optical elements further decreases, ammonium sulfate deposition may be reduced even further.

The fourth optical illumination device according to the present invention comprises a discharge lamp, a member for reflecting and condensing or converging light from said discharge lamp and sending the light to the object to be illuminated, and a light transmission member installed in the light illumination path between the light reflecting and condensing element and the object to be illuminated, and having a small transmissivity to the light having at least one of the four wavelength bands of 105–180 nm, 180–240 nm, 260–340 nm, and 340–390 nm.

BRIEF DESCRIPTION OF THE DRAWINGS

FIG. 10 is a diagram of the second embodiment of the present invention, including a partially sectional view;

DESCRIPTION OF THE PREFERRED EMBODIMENTS

Various embodiments of an optical illumination device in accordance with this invention are described below with reference to FIGS. 5 to 13. In these embodiments, this invention is applied to the optical illumination system of a projection exposure apparatus (e.g. stepper, aligner) for manufacturing semiconductors. The elements in FIGS. 5 to 13 corresponding to those in FIG. 1 have the same numerals and corresponding descriptions are therefore omitted. In these embodiments, an i-line of a wavelength of 365 nm of a mercury-arc lamp is used as the illumination light.

Figure 5:
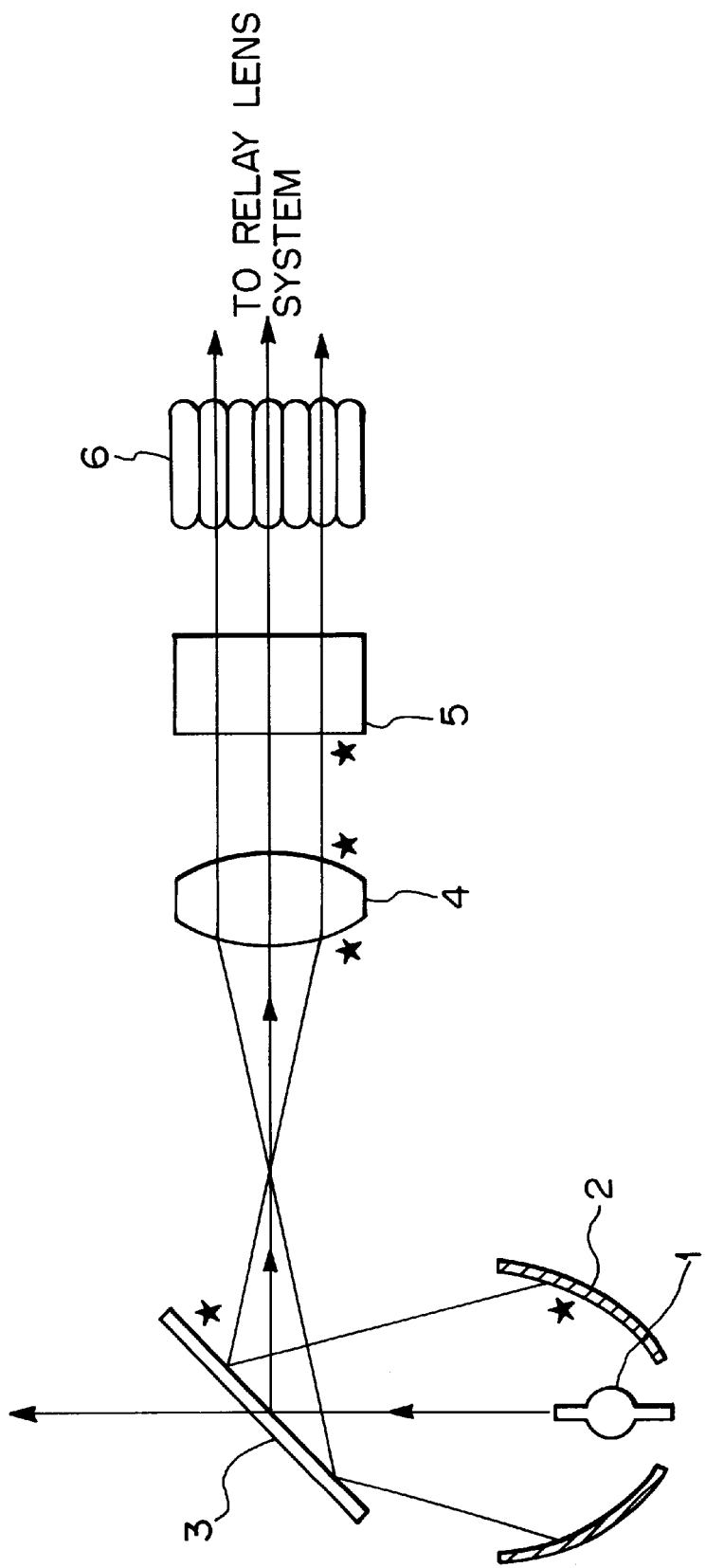
FIG. 5 is a diagram of the basic structure of the first and second embodiments of the present invention.

FIG. 5 shows an embodiment of the optical system of an optical illumination device in accordance with this invention. In this invention, light radiated from the mercury-arc lamp 1 is reflected by the inner surface of a light reflecting and condensing member or elliptical mirror 2 to travel to a mirror 3 for deflecting an optical path. A dichroic mirror that reflects ultraviolet light and allows visible and infrared light to pass through is used as the mirror 3. The light reflected by the mirror 3 enters a collimator or input lens 4. The light exiting from the input lens 4 then enters a band-pass filter 5, which selects an illumination light comprising an i-line from the light received. The illumination light then enters a fly-eye lens 6, and light from many secondary light sources formed on the surface of the fly-eye lens 6 travels to a relay lens system not shown. The relay lens system may be located between the fly-eye lens 6 and the condenser lens 8, and generates a conjugate plane with a reticle 9. An interference filter may be used as a band-pass filter.

In FIG. 5, the light passing through the mirror 3 is directed to a lamp monitor (not shown), a wafer global alignment (WGA) optical system, and an autofocus (AF) optical system. The lamp monitor comprises photoelectric transfer equipment for monitoring the luminescent quantity of the mercury-arc lamp 1, the WGA optical system performs rough alignment of the wafer on which the pattern of the reticle is projected, and the AF optical system obliquely irradiates against the wafer detection light to which a photoresistor is not sensitive, thereby detecting the focal point of the wafer.

In FIG. 5, clouding was observed on the surfaces marked with a black star, that is, the inner surface of the light reflecting and condensing or converging member or elliptical mirror 2, the reflecting surface of the mirror 3, both sides of the collimator or input lens 4, and the surface of incidence of the band-pass filter 5, when no action was taken to prevent this phenomenon. No distinctive clouding surface was found in the optical elements subsequent to the band-pass filter 5. Thus, the assumption can be made that clouding is a photochemical phenomenon associated with a light with a wavelength less than 365 nm. In view of this, this invention prevents clouding effectively.

First Embodiment

A first embodiment is described with reference to FIG. 6. The elements in FIG. 6 corresponding to those in FIG. 5 have the same reference numerals and corresponding descriptions are therefore omitted. In this embodiment, an air curtain comprising chemically clean air is formed for optical elements other than the elliptical mirror 2 which are located between the light reflecting and condensing member or elliptical mirror 2 and the surface of incident of the band-pass filter 5, where clouding occurred. These optical elements were thus isolated from an atmosphere less chemically clean. The chemically clean air herein is obtained using an impurity removal member or filter, generally called a chemical filter, described below to remove ammonia ions (or ammonia) and sulfuric acid ions by means of a chemical adsorption mechanism and also to remove organic silanol by means of a physical adsorption mechanism since these materials are considered to cause clouding.

One of the methods for allowing the air to pass through the chemical filter is to integrate this filter with an HEPA filter for dust removal and a blasting fan or others if dust causes problems. In this case, the flow of air is preferably kept uniform on the surface of the chemical filter to enable efficient usage. The HEPA filter can be omitted if air at the downstream side of the chemical filter contains few particles and is thus sufficiently clean or if the primary air, the chemical filter, and the blasting fan generate little dust and pose no problem. The blasting fan can also be omitted if primary air has sufficient positive pressure, or if secondary air has sufficient negative pressure.

The air curtain may be formed for each optical element or a wider alternative can be formed for a plurality of optical elements if they are adjacent. FIG. 6 shows an air curtain formed for the collimator or input lens 4 alone, and the illustration is omitted for other optical elements.

Figure 6:
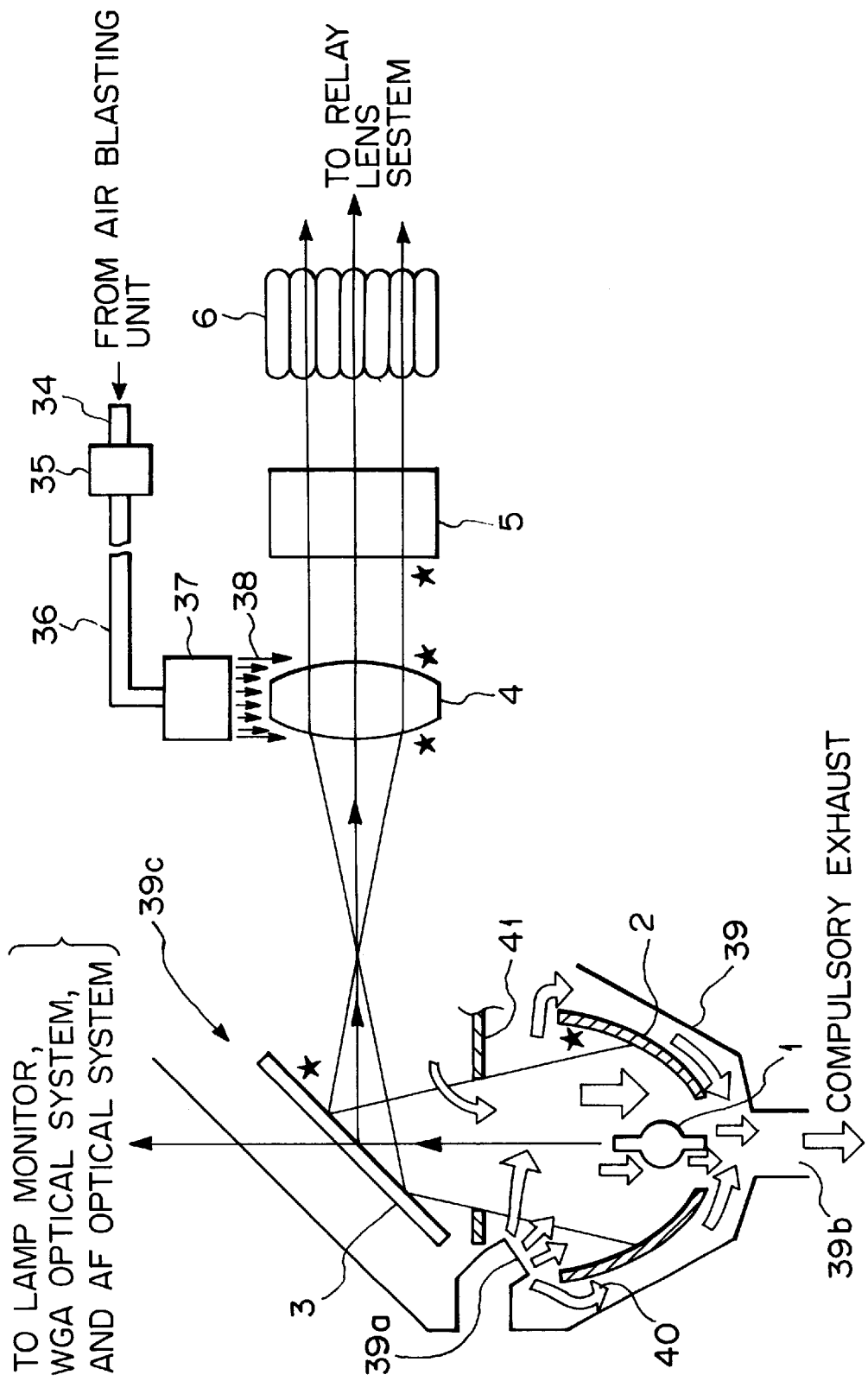
FIG. 6 is a diagram of the first embodiment of the optical illumination device of the present invention, including a partially sectional view.

In FIG. 6, air from the blasting unit (not shown) is guided via a pipe 34 to the chemical filter 35, where impurities are removed. The clean air obtained is then guided via a pipe 36 to an ejection nozzle 37 for forming an air curtain. The clean air is thus ejected from the nozzle 37 against the input lens 4. The nozzle 37 is located so as not to obstruct the optical illumination path, and must meet the requirements below.

Figure 7A:
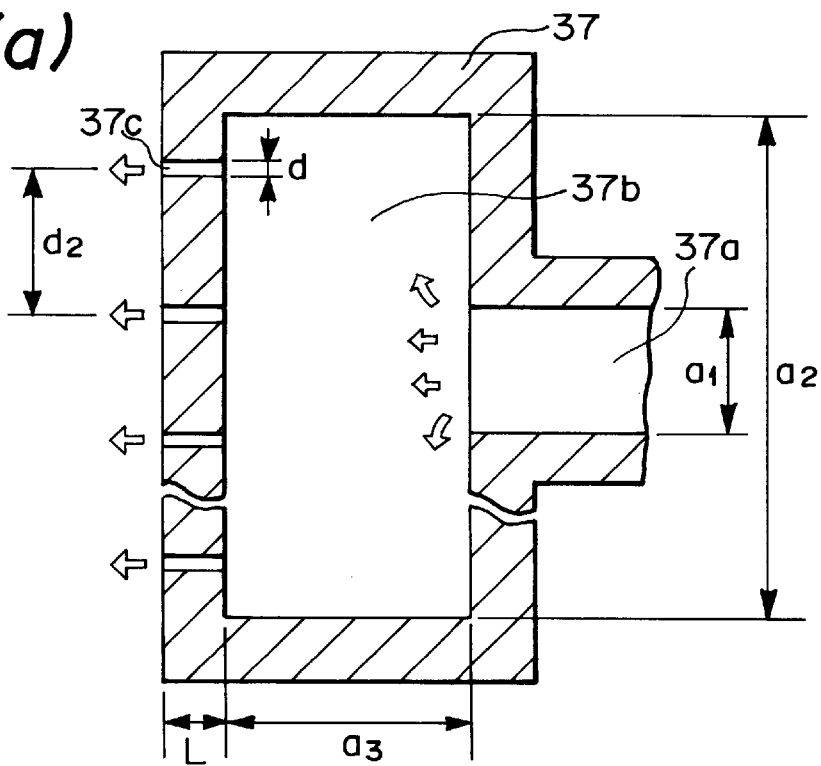
FIG. 7($a$) is a sectional view of the ejection nozzle of the air curtain used in the first embodiment of the present invention and FIG. 7($b$) is a bottom view of the ejection nozzle 37 in FIG. 7($a$)
Figure 7B:
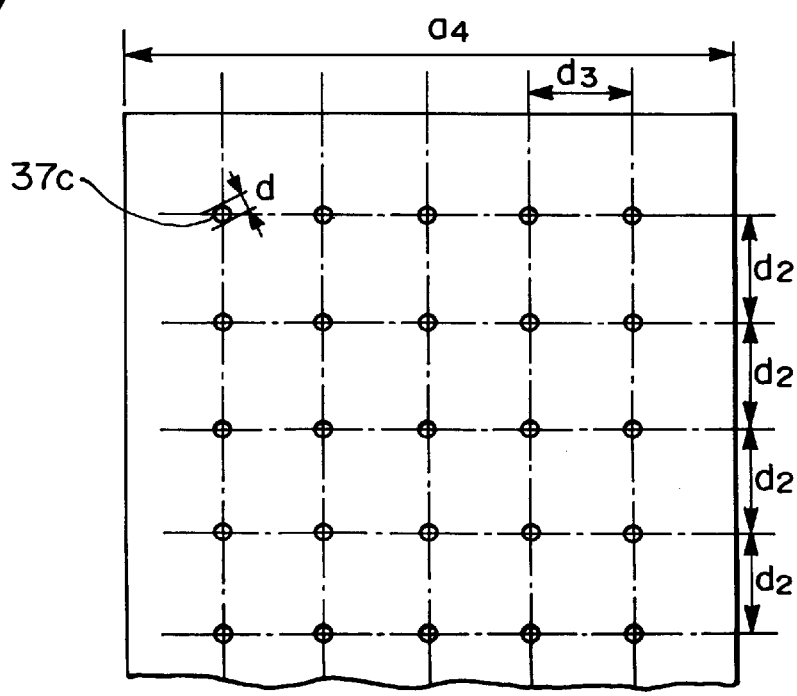

FIG. 7 shows a simplified configuration of the ejection nozzle 37, which comprises a box-like main body with a hollow section 37b to which clean air is supplied via an opening 37a. Many straight tubular ejection ports 37c with a certain diameter (d) are formed on the bottom of the hollow section 37b at a horizontal pitch $d_3$ and a vertical pitch $d_2$, as shown in FIG. 7(b).

In formation of the air curtain, clean air must be blown against optical elements and elements must be shut off from any atmosphere which is less chemically clean. To this end, clean air ejected must be distributed continuously. This is achieved by close alignment of the ejection ports 37c. The diameter $a_1$ of the opening 37a of the ejection nozzle 37, the vertical length $a_2$ and thickness $a_3$ of the hollow section 37b, the horizontal length $a_4$ of the bottom of the ejection nozzle 37, the diameter (d), and the pitches $d_2$, $d_3$ thus should be determined experimentally so that the above conditions can be achieved by visualization of the flow or other methods.

Turbulent mixing should be prevented between the atmosphere and clean air, because the effect of clean air is reduced substantially if it is mixed with the atmosphere at a certain distance from ejection ports 37c even if it is distributed continuously. For this purpose, clean air should be provided as a laminar flow. The flow should thus be uniform in the hollow section 37b shown in FIG. 7(a), and the Reynolds number Re defined by the opening diameter of the ejection port 37c should be sufficiently small. In order to laminate the flow in the hollow section 37b, the opening diameter $a_1$ of the opening 37a, the vertical length $a_2$ and thickness $a_3$ of the hollow section 37b, and the horizontal length $a_4$ of the bottom of the ejection nozzle 37 thus should be determined experimentally so that the above conditions can be achieved by visualization of the flow or other methods.

Figure 8:
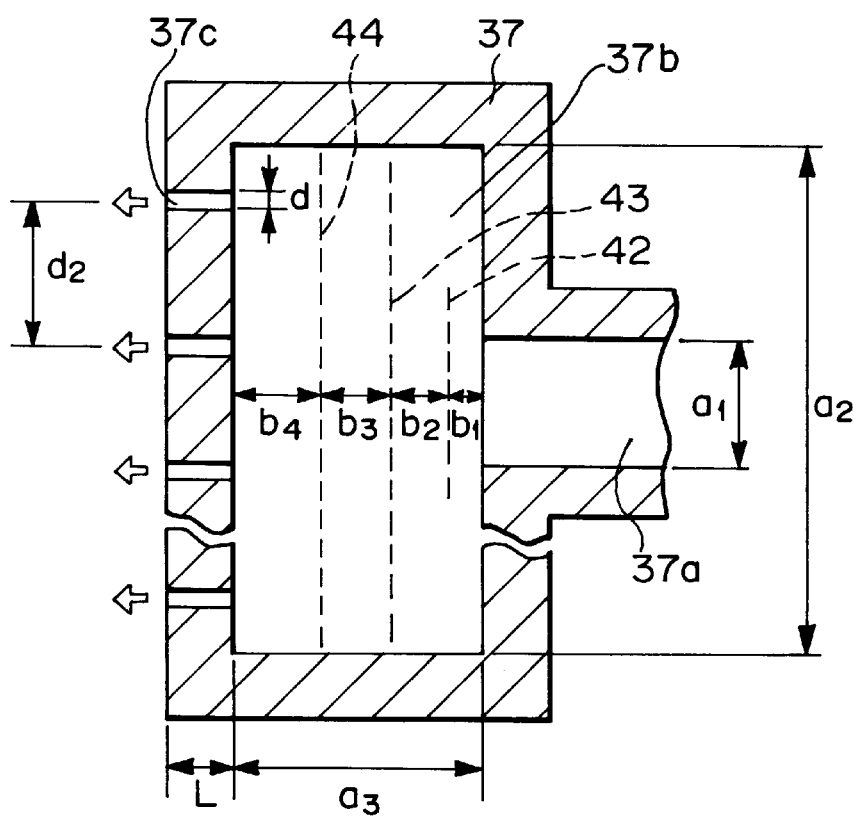
FIG. 8 is a sectional view showing the ejection nozzle 37 of the air curtain used in the first embodiment modified by providing an air laminating mechanism.

As shown in FIG. 8, lattices 42, 43, and 44 for lamination may be arranged in the hollow section 37b in such a manner that they overlap. Although three lattices 42 to 44 are arranged in FIG. 8, the number of lattices is not particularly limited. The intervals $b_1$, $b_2$, $b_3$, $b_4$ among the lattices 42, 43, 44 should be determined experimentally. Punched boards or nets with small meshes can be used as lattices 42 to 44.

The chemical filter and a filter for preventing dust, for example, a freon resin filter that generates little gas, can be installed in the hollow section 37b. Since these filters can straighten the flow, very good laminar flows can be obtained as long as space has been reserved to make the air pressure uniform. Advantageously, many ejection ports 37c need not be arranged at a specified pitch. However, primary air should be high (that is, 20 mm $H_2O$ higher than secondary air) to overcome pressure loss. Dry air cannot be used as primary air in the case of an activated carbon filter with its surface having been chemically treated.

The Reynolds number Re of the ejection port 37c can be defined by the following equation:

$$Re = Vd/v \qquad (3)$$

wherein V is a typical flow in the straight tubular section of the ejection port 37c, (d) is the inner diameter of the straight tubular section if it is smooth (otherwise, this value can be substituted for by the length that represents the roughness of the tubular wall), and v is the coefficient of kinematic viscosity. In this case, a laminar flow is established if the following value is obtained.

$$Re < 1000 \qquad (4)$$

The flow should be checked visually to determine whether the flow is actually laminar, after the above condition has been met. The length L of the straight tubular section of the ejection port 37c shown in FIG. 7(a) is then determined. Length L is not very important if the diameter (d) is sufficiently small.

In the first embodiment, an air curtain that meets the above requirements is formed for a predetermined optical element or member. The shape of the ejection port 37c of the ejection nozzle 37 is desirably such that flow turbulence is minimized. Of course, the ejection port 37c can have any mechanism or shape as long as the flow is laminar. These factors can be determined experimentally.

Figure 9A:
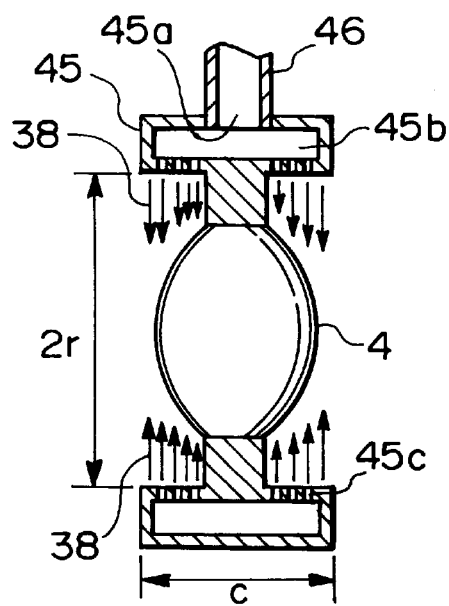
FIG. 9($a$) is a sectional view of another example of the air curtain mechanism used in the first embodiment and FIG. 9($b$) is a left side view of the air curtain mechanism in FIG. 9($a$)
Figure 9B:
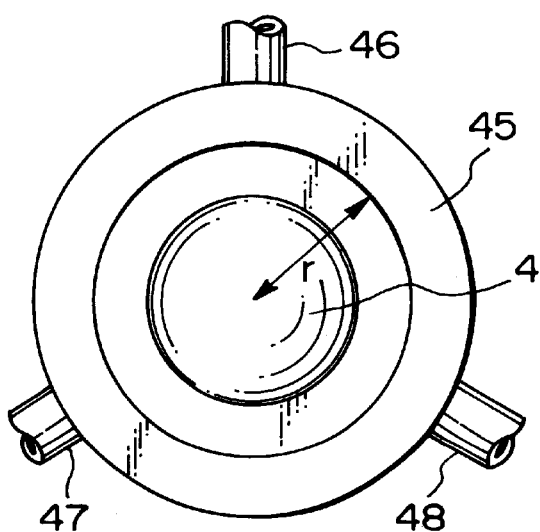

FIG. 9 shows another example of an air curtain. In FIG. 9(a), the ejection nozzle 37 shown in FIG. 7 has been applied to a lens holder 45 for the collimator or input lens 4. That is, a hollow section 45b is formed inside the lens holder 45 to supply clean air to the section 45b via the pipe 46 and opening 45a, and to allow many ejection ports 45c formed on the bottom of the hollow section 45b, that is, the inner circumferential wall of the lens holder to eject air 38 against both sides of the collimator or input lens 4. The diameter of the surface on which the exhaust ports are formed is 2r and the thickness of the lens holder 45 is (c). As shown in FIG. 9(b), in this example, air is supplied from three points via pipes 46, 47, and 48 in order to facilitate lamination. The inside of the hollow section 45b connected to the three pipes 46 to 48 is desirably divided so as to prevent the three sources of air from interfering with each other. The thickness of the lens holder 45 is desirably as large as possible to cover the input lens 4 thick.

In FIG. 6, a member or element covering the mercury-arc lamp 1, the light reflecting and condensing element or elliptical mirror 2, and the mirror 3 is shown. This covering member comprises a duct 39, and an air flow 40 for cooling the mercury-arc lamp 1 is supplied from the ejection port 39a of the duct 39 near the end of the elliptical mirror 2 via a sirocco fan or other. The air flow 40 is ejected forcibly from an exhaust port 39b of the duct 39 on the bottom of the elliptical mirror 2. A partition plate 41 formed with an opening allowing light from the mercury-arc lamp 1 to pass therethrough is fixed between the elliptical mirror 2 and the mirror 3 which are inside the duct 39 so that the air from an opening 39c facing the shutter 31 of the duct 39 passes through the opening of the partition plate 41 and is then ejected forcibly from an exhaust port 39b. Light for the lamp monitor, the WGA optical system and the AF optical system which is passed through the mirror 3, exits via the transmission windows on both sides of the duct 39.

An air curtain is difficult to produce for the elliptical mirror 2 because of heat irradiated against the elliptical mirror 2 from the mercury-arc lamp 1 and the presence of a large air flow 40 near the elliptical mirror 2. The temperature should then be controlled to prevent ammonium sulfate from sticking to the elliptical mirror 2. Such temperature control is based upon the fact that the dissolution of ammonium sulfate (($NH_4)_2SO_4$)) starts at about 120° C. (*Kagaku Daijiten*, Vol. 9, P. 690, Kagaku Daijiten Compilation Committee, Kyoritsu Shuppan, 1964) and the optical member is maintained at that temperature or higher. The elliptical mirror 2 can be heated easily to a high temperature because of its adjacency to the mercury-arc lamp 1, which is an effective heat source. This will be further described below.

Second Embodiment

A second embodiment of this invention is described with reference to FIG. 10. The elements in FIG. 10 corresponding to those in FIG. 6 have the same reference numerals and corresponding descriptions are therefore omitted.

FIG. 10 shows an optical illumination device in accordance with this embodiment. The collimator or input lens 4, the band-pass filter 5, and the fly-eye lens 6 are covered by a member, which is a cylindrical duct 49 in this embodiment. A cooling air flow 50 from which impurities are removed by the chemical filter (not shown) is ejected from the ejection port 49a on the side of the duct 49 against the band-pass filter 5 inside the duct 49 via the sirocco fan. As a result, the band-pass filter 5 is cooled.

Branches of the air flow 50 are ejected forcibly from the exhaust port 39b of the duct 39 through the opening 49b adjacent a shutter (not shown) of the duct 49, the opening 39c of the duct 39, and the opening of the partition plate 41. Illumination light with a selected wavelength (i-line) is supplied to the relay lens system (not shown) via the opening 49c at the side of the fly-eye lens 6 of the duct 49.

In this embodiment, an air current flowing toward the mercury-arc lamp 1 is present around the mirror 3 and the band-pass filter 5 because the forcible ejection flow with a large air capacity for cooling the mercury-arc lamp 1 is present near the light reflecting and condensing member or elliptical mirror 2. The presence of the compulsory ejection flow inhibits the atmosphere from entering the periphery of the upper mirror 3. One source of the branch of the forcible exhaust flow is the air flow supplied by the sirocco fan from the cooling ejection nozzle 49a of the band-pass filer 5. The outside air is drawn away from the ejection port 49a. In this example, chemically clean air can be supplied to all optical elements subject to clouding because the air passed through the chemical filter is provided from the ejection nozzle 49a.

If the mercury-arc lamp 1 has a very high power, it generates a great deal of heat, and the upper mirror 3 may become extremely hot. In such a case, a new air intake port should be provided at the top for cooling. Additional use of a temperature control method for the elliptical mirror as described below also enables clouding to be prevented effectively. Air that has passed through the chemical filter may also be ejected into the duct 39 from the ejection nozzle 39a for cooling the mercury-arc lamp. This allows clouding to be prevented effectively.

As described above, much air cleaned by the chemical filter can be supplied from the ejection port 49a (and 39a) to prevent impurity gases from contacting optical members and thus clouding materials from adhering to optical elements.

Next, the chemical filter for removing impurities used in Embodiments 1 and 2 is described in detail.

Filters for removing ions include ion exchange resins and fibers, and ion exchange fibers are more suitable for processing gases because of their large surface area, high reaction speed, and easy molding and processing. An ion exchange fiber is made, for example, by radiation-induced graft polymerization from polypropylene. Ion exchange fibers include two kinds: acid cation exchange fibers and basic anion exchange fibers, both of which can be selected depending upon the desired ion polarity. This embodiment uses both filters, and can cause positive (+) ions or basic gases such as $NH_4^+$ or amine to be adsorbed by the former, while negative (−) ions and acid gases such as $SO_4^{2-}$ or $NO_x$ are adsorbed by the latter. For example, 90% of $NH_4^+$ can be absorbed even if the concentration thereof is low by neutralization reaction of it with strong acid cation exchange fibers. Negative ions can be absorbed by neutralization reaction with basic anion exchange resins. These ion exchange resins are used to remove ionic impurities, and are not suitable to remove organic materials.

In addition, although activated carbon filters are basically effective for almost all impurities, organic compounds with a large molecule size, a large intermolecular force, low solubility into water, or a low polarity generally have a higher adsorptivity. They are thus effective for the removal of organic materials that cannot be readily adsorbed by ion exchange resins, for example, organic silanes such as trimethylsilanol or HMDS. In the selection of activated carbon filters, the surface area, average pore diameter, and shape of the activated carbon, and whether or not it generates dust should be considered. For this embodiment, in view of the pressure loss of the device, a sheet of urethane fibers containing activated carbons, activated carbon fibers processed as a sheet, or honeycomb-like activated carbons are desirable. Activated carbons with acid materials or weak alkaline materials are effective for the removal of ionic impurities. Zeolites are also effective for the removal of almost all impurities. Pore diameter should be selected depending upon the size of the impurity to be removed.

In this manner, filters alone can remove impurities to a certain degree in the case of activated carbons or zeolites. However, since the pore diameter of these adsorbents is determined to match the particle size of the target impurity for optimization, it is sometimes more efficient to use various adsorbents together, for example, an ion exchange filter is used to remove ionic materials and a zeolite filter is also used to remove organic materials.

The chemical filter is installed at ejection ports (49a, for example) together with an HEPA filter for preventing the ingress of particles. The two filters may be located separately to take in only the air flow filtered by passing through each filter. Since the HEPA filter causes a large pressure loss, the primary air should be force-fed by a blower or other similar equipment. In this case, material of such equipment should be selected carefully so that impurities will not mix with the air that has passed through the filter. Air handling is preferably avoided at the secondary side, that is, at the downstream side of the air flow from the HEPA filter.

Further, in order to inhibit harmful ions from being generated, the retaining or blocking material that is the source of such ions can be replaced with one that generates fewer ions. Nitrogen gases ($N_2$) with high purity can be used to avoid the effect of oxygen ($O_2$). However, in order to provide nitrogen gas to the entire illumination system, a large quantity of this gas is required, and oxygen may run short. The exhaust of the illumination system should thus be managed properly.

Third Embodiment

This third embodiment may be implemented alone or combined with the first or second embodiment.

Figure 11:
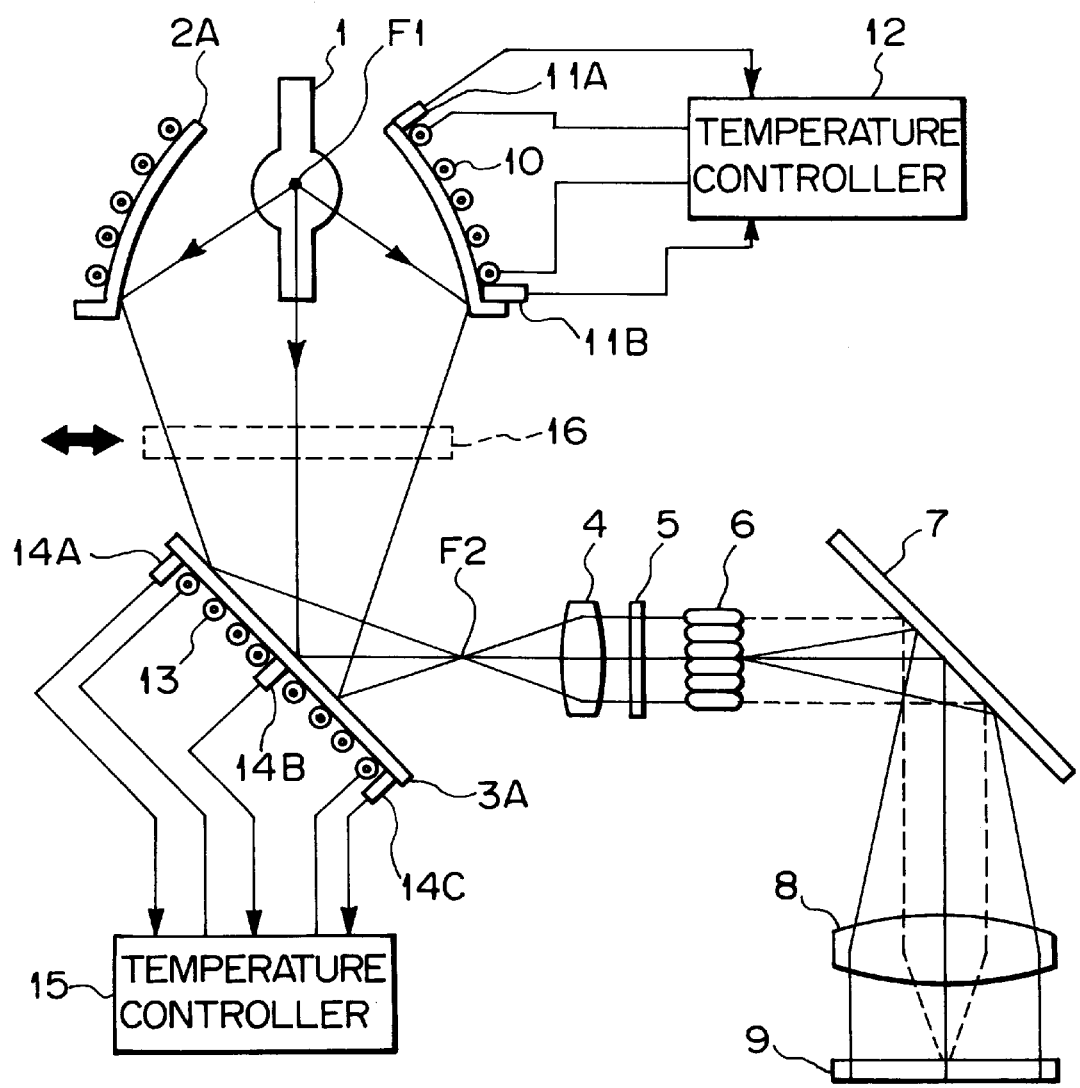
FIG. 11 is a diagram showing heat insulation and heating mechanisms of the third embodiment of the present invention.
Figure 12A:
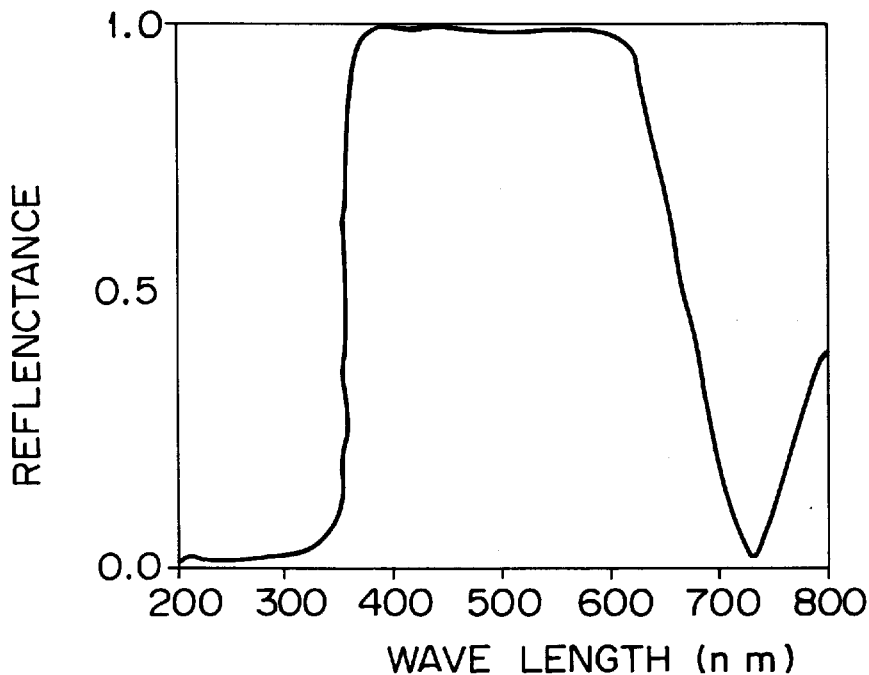
FIG. 12($a$) is a graph showing the reflectance of the elliptical mirror 2A and mirror 3A in FIG. 11 and FIG. 12($b$) is a graph showing the transmissivity of the filter 16 in FIG. 11.

FIG. 11 shows an optical illumination device in accordance with this embodiment. In this figure, the luminous point of a super-high-pressure mercury-arc lamp 1 is located on the first focal point of a light reflecting and condensing member or elliptical mirror 2A, and openings through which the electrodes of the mercury-arc lamp 1 pass are formed at the ends of the elliptical mirror 2A. Various multilayer dielectric materials, for example, are vapor-deposited on the inner surface of the elliptical mirror 2A, and the reflectance (spectral reflectance characteristic) of the inner surface is set at 0.1 for a wavelength of 340 nm as shown in FIG. 12(a). In fact, since the super-high-pressure mercury-arc lamp irradiates little light having a wavelength of 240 nm or less, the reflectance of the elliptical mirror 2A may be larger at a wavelength of 240 nm or less.

In this embodiment, a heating device may also be provided to prevent white ammonium sulfate powder from adhering to the elliptical mirror 2A. That is, a heating coil 10 is wound round the elliptical mirror 2A and temperature sensors 11A and 11B are installed at the ends of the elliptical mirror 2A. Temperature data detected by the temperature sensors 11A and 11B is supplied to a temperature controller 12, which regulates the amount of current to be supplied to the heating coil 10 to maintain the temperature of the elliptical mirror 2A at 120° C. (the decomposition temperature of ammonium sulfate) or higher. The heating coil 10 need not be subjected to very high current because the elliptical mirror 2A is near the mercury-arc lamp 1 that serves as a heat source.

Figure 13B:
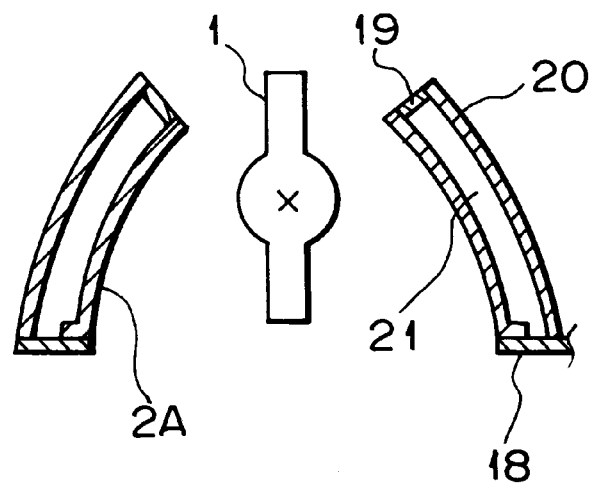
FIG. 13($a$) is a side view showing an example of the heat insulator for the elliptical mirror 2A in FIG. 11 along the cross-section and FIG. 13($b$) is a side view showing another example of the heat insulator along the cross-section.

A heat insulator can be provided instead of the heating device for the light reflecting and condensing element or elliptical mirror 2A. For example, as shown in FIG. 13(a), a heat insulator element or member 17 can be provided on the outer surface of the elliptical mirror 2A. In addition, as shown in FIG. 13(b), the outer surface of the elliptical mirror 2A is covered with plates 18, 19 and a curved plate 20 to form, on the outer surface, a space isolated from the atmosphere, thereby insulating the heat of the elliptical mirror 2A.

Back to FIG. 11, light radiated from the mercury-arc lamp 1 is reflected by the inner surface of the light reflecting and condensing member or elliptical mirror 2A and travels to a mirror 3A for deflecting the optical path. Various multilayer dielectric materials are vapor-deposited on the reflecting surface of the mirror 3A, as described above, and the reflectance (spectral reflection factor) of the surface is set at 0.1 for a wavelength of 340 nm as shown in FIG. 12(a). In fact, since the super-high-pressure mercury-arc lamp irradiates little light having a wavelength band of 240 nm or less, the reflectance of the mirror 3A may be larger for a wavelength band of 240 nm or less.

In order to provide the elliptical mirror 2 and/or the mirror 3A with the above reflectance, different films can be deposited alternately on a substrate constituting a mirror in the sequence of a film of a material with a high refraction factor, a film of a material with a low refraction factor, and a film of a material with a high refraction factor. If the material with a high refraction factor is referred to as H, the material with a low refraction factor L, and the number of cycles (n), the basic composition of the coverage cycle can be expressed as follows:

$$\left(\frac{L}{2} \cdot H \cdot \frac{L}{2}\right)^n$$

wherein the optical film thickness of the material with a high refraction factor nd=$\lambda$/4 and the optical film thickness of the material with a low refraction factor nd=$\lambda$/4, L/2=$\lambda$/8.

Materials with a high refraction factor include $TiO_2$, $Ta_2O_5$, $ZrO_2$, and $HfO_2$, one of which can be selected arbitrarily. Materials with a low refraction factor include $SiO_2$.

Figure 14:
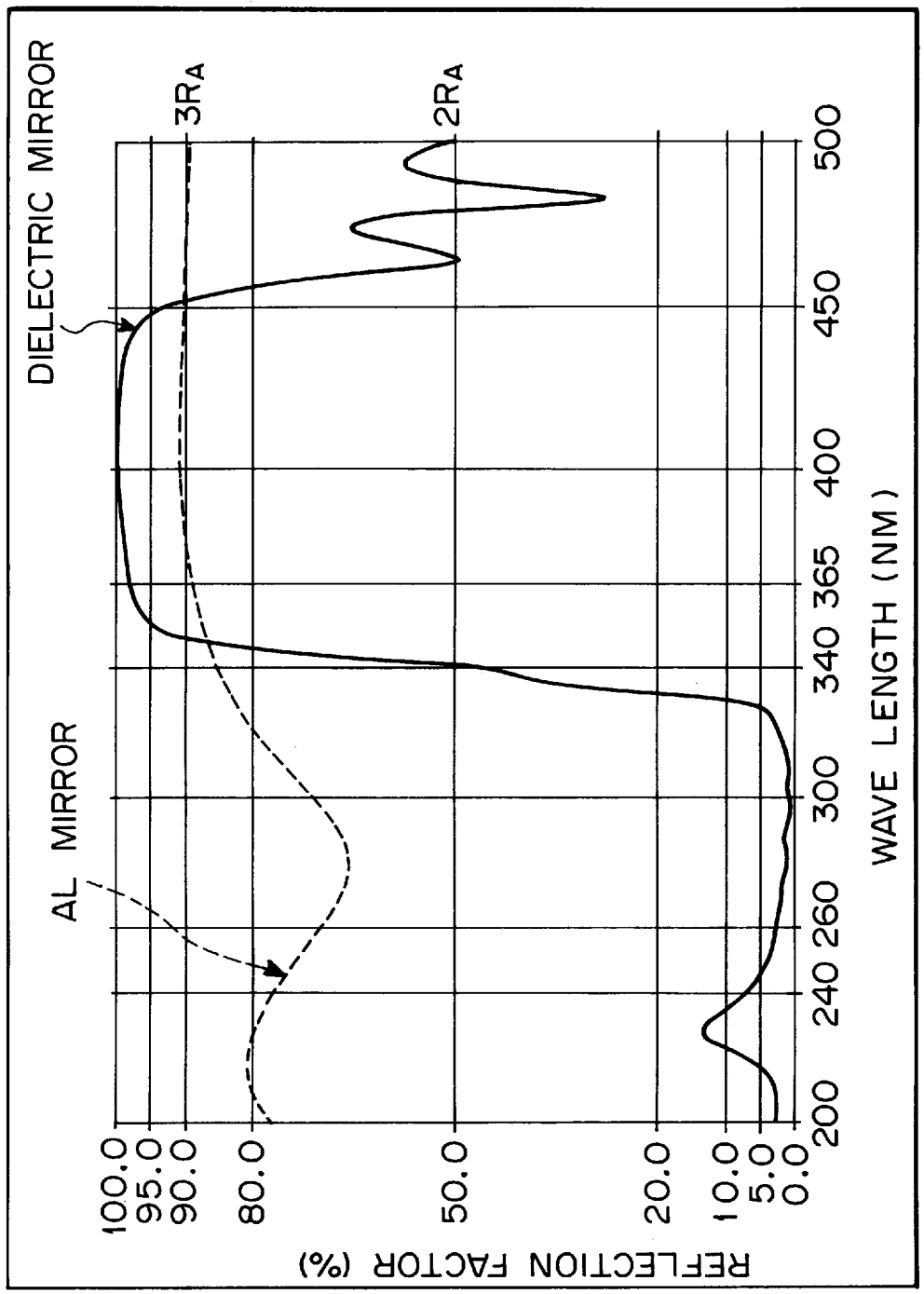
FIG. 14 is a graph comparing the reflectance of the mirror coated with a dielectric film using $TiO_2$ as a high-refraction substance and $SiO_2$ as a low-refraction substance, with the reflectance of a conventional Al mirror.

FIG. 14 compares the reflectance of a conventional Al mirror (formed by deposition of an Al film on a substrate and subsequent deposition of a $SiO_2$ film on the Al film) and a mirror with a dielectric film formed using $TiO_2$ as a high-refraction material and $SiO_2$ as a low-refraction material. In this figure, solid lines represent the reflectance characteristic for the mirror covered with a dielectric film, and broken lines represent the reflectance characteristic for the Al mirror. This figure clearly shows that the reflectance is 0.5 or less for a light with a wavelength of 260–340 nm and, in particular, 0.1 or less for a light with a wavelength of about 260–330 nm.

In this embodiment, a heating device may also be provided to prevent white ammonium sulfate powder from adhering to the mirror 3A. That is, a heating coil 13 is wound round the mirror 3A and temperature sensors 14A, 14B, and 14C are installed at both ends and the middle of the back of the mirror 3A. Temperature data detected by temperature sensors 14A, 14B, and 14C is supplied to a temperature controller 15, which regulates the amount of current to be supplied to the heating coil 13 to maintain the temperature of the mirror 3A at 120° C. (the decomposition temperature of ammonium sulfate) or higher. Also for the mirror 3A, a heat insulator similar to that shown in FIG. 13 can be provided instead.

Further, in principle, ammonium sulfate can be prevented from adhering to the mirror 3A, the collimator or input lens 4, and the band-pass filter 5 without provision of heating or heat insulators for the mirror 3A.

In FIG. 11, light reflected by the mirror 3A is collected on the second focal point F2 of the elliptical mirror 2A to form a light source image on the second focal point F2. Divergent light from this light source image is converted by the input or collimator lens 4 into virtually parallel luminous flux, which enters the band-pass filter 5 having a narrow band. The irradiated i-line (a wavelength of 365 nm) light selected by the band-pass filter impinges on a fly-eye lens 6, and divergent light from many secondary light sources formed on the focal plane behind the fly-eye lens 6 (on the reticle side) passes through the mirror 7 and the condenser lens 8 and illuminates the pattern-formation surface of the reticle 9 on the surface to be illuminated so that light beams overlap.

As described above, the light reflecting and condensing element or elliptical mirror 2A and the deflection mirror 3A have reflectance for light having a wavelength within the absorption band for sulfur dioxide set to a small value. The production of ammonium sulfate is thus reduced at the surfaces of incidence of the input lens 4 and the band-pass filter 5 to prevent a decrease in the transmissivity of illumination light for the input lens 4 or the band-pass filter 5. If the elliptical mirror 2A and the mirror 3A are maintained at temperatures higher by the heating and heat insulator devices, ammonium sulfate is almost decomposed and the reflectance of the required illumination light is not reduced.

In the above embodiment, the reflectance for light with a wavelength within the absorption band for sulfur dioxide is reduced for both the elliptical mirror 2A and the mirror 3A, but the same reflectance may be reduced only for the elliptical mirror 2A.

Figure 12B:
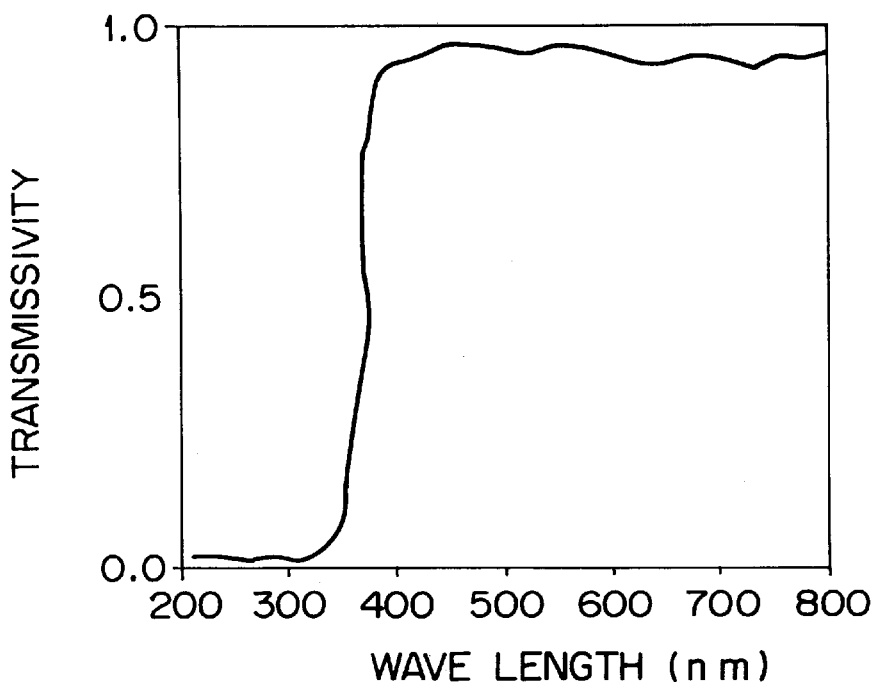

In FIG. 11, a light transmission means, that is, a filter 16 for absorbing light having a wavelength within the absorption band for sulfur dioxide may be located between the elliptical mirror 2A and the mirror 3A for deflecting an optical path. The wavelength dependence of transmissivity (light transmission characteristic) of the filter 16 should be set at 0.1 for a wavelength of 340 nm or less as shown in FIG. 12(b). In fact, since the super-high-pressure mercury-arc lamp emits little light having a wavelength band of 240 nm or less, the reflectance of the filter 16 may be larger for a wavelength band of 240 nm or less.

Only the filter 16 shown in FIG. 11 can be used to absorb light with a wavelength within the absorption band for sulfur oxide among the light reflected by the elliptical mirror without adjusting the reflectance of the elliptical mirror 2A.

In order to provide the filter 16 with the capability of absorbing light with a wavelength within the absorption band for sulfur dioxide, a film of a material with a high refraction factor (one of $TiO_2$, $Ta_2O_5$, $ZrO_2$, and $HfO_2$) and a film of a material with a low refraction factor ($SiO_2$) can be deposited alternately on a glass substrate (quartz or other material), as described above in the reflectance characteristic of the elliptical mirror.

If this filter 16 is arranged, the amount of white ammonium sulfate powder adhering to the mirror 3A is reduced because little light having a wavelength within the absorption band for sulfur dioxide is irradiated against the mirror 3A. As a result, the mirror 3A does not require a heating device or heat-insulator. A heating device or a heat-insulator can also be provided for the filter 16. However, since the filter 16 is inexpensive, for example, the turret method is used to allow the filter 16 to be replaced easily so that the filter 16 can be replaced if illumination efficiency becomes degraded.

The filter 16 can also be located, for example, between the mirror 3A and the collimator or input lens 4.

In the above example, the i-line from the mercury-arc lamp is used as illumination light. If the g-line (a wavelength of 436 nm) from the mercury-arc lamp is used as illumination light, it is preferable that the reflectance of the elliptical mirror 2A and the mirror 3A be reduced also for light having a wavelength of 340–390 nm. This reduces the production of ammonium sulfate. In addition, if a xenon lamp is used instead of the mercury-arc lamp 1, it is possible to prevent ammonium sulfate from adhering by applying this invention thereto.

As described above, if light irradiated by the light source of an illumination light source device contains light having a wavelength band within the absorption band for sulfur dioxide (105–180 nm, 180–240 nm, 260–340 nm, or 340–390 nm), a reflecting optical element or member (the elliptical mirror 2A or mirror 3A) the reflectance of which for such light is kept small or a light transmission member (the filter 16) transmissivity of which for such light is kept small can be used to prevent ammonium sulfate from adhering to optical elements or members (the mirror 3A, input lens 4, or band-pass filter 5) positioned at the side of the object from the light source. The reflecting optical member (the elliptical mirror 2A or mirror 3A) the reflectance of which for such light is reduced or the light transmission member (the filter 16) transmissivity of which for such light is kept small is preferably heated by a heating device or heat insulator. However, if these optical members are provided near the light source or in a place on which light from the light source converges, they become very hot and ammonium sulfate can thus be prevented from adhering without provision of a new heating device or heat insulator.

Figure 1:
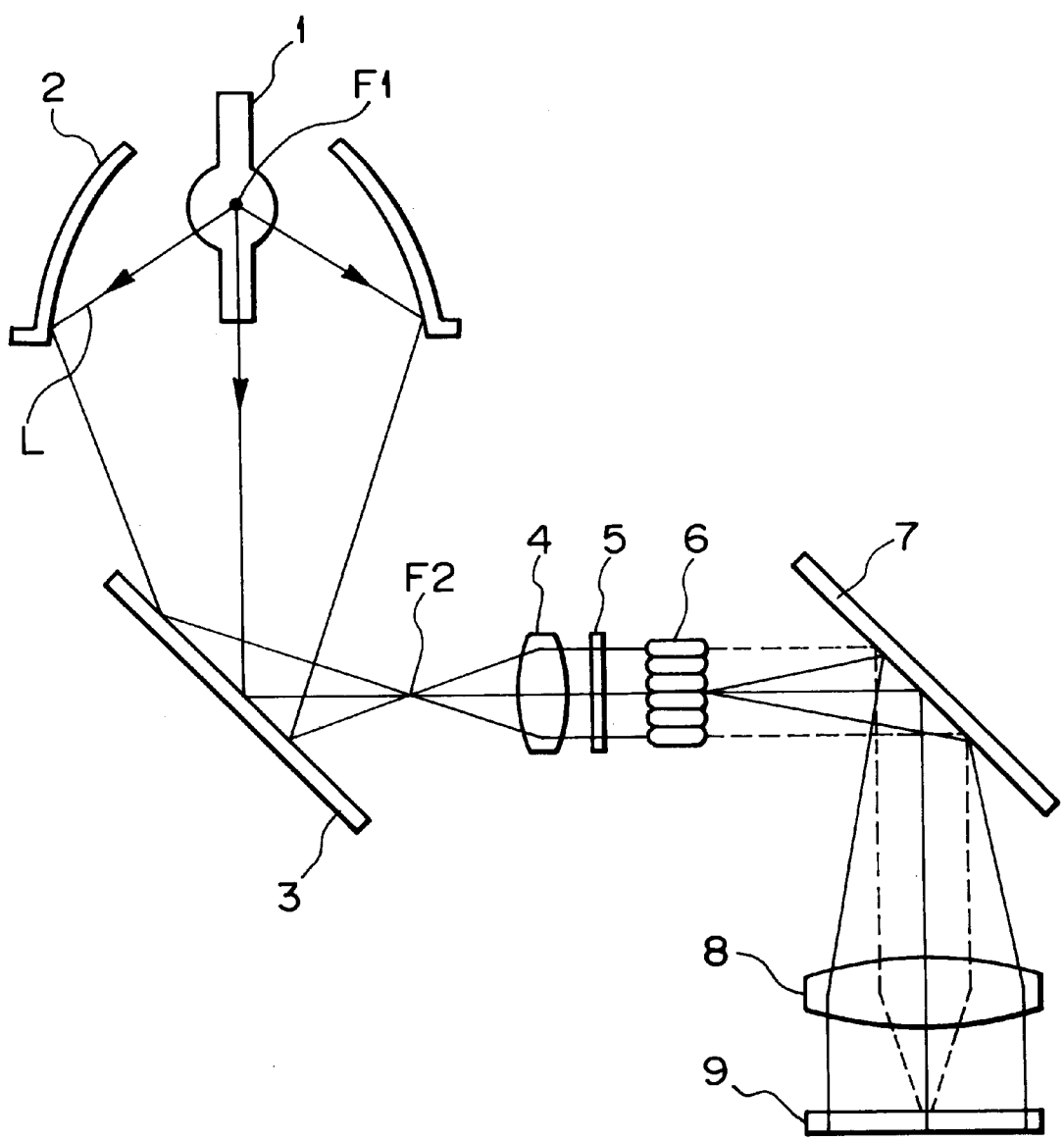
FIG. 1 is a diagram of a prior-art optical illumination device, including a partially sectional view.
Figure 2:
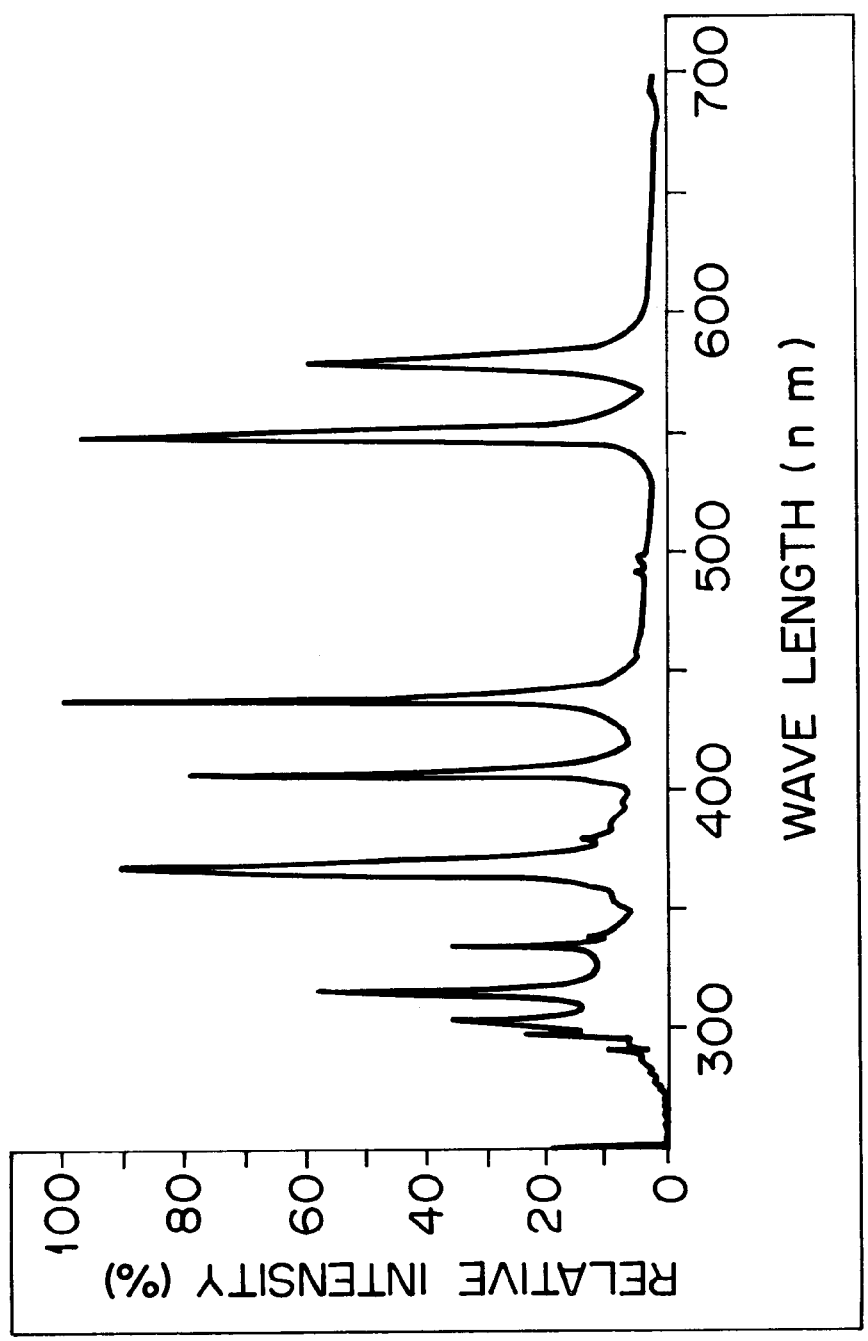
FIG. 2 is a graph showing the emission spectrum distribution of a super-high-pressure mercury-arc lamp.
Figure 3A:
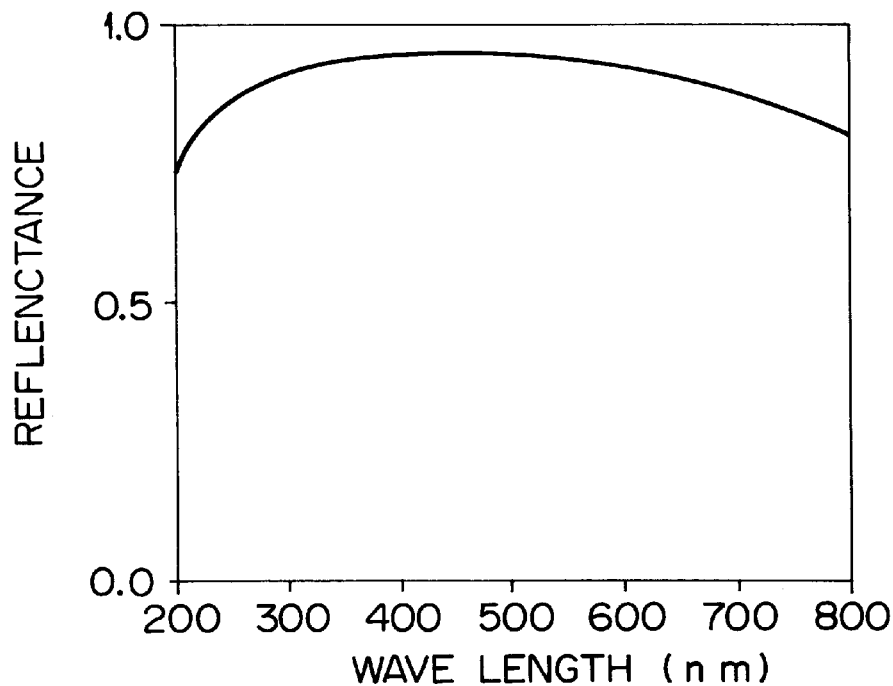
FIG. 3($a$) is a graph showing the reflectance of a conventional aluminum reflecting mirror and FIG. 3($b$) is a graph showing the reflectance of a conventional multilayer dielectric reflecting mirror.
Figure 3B:
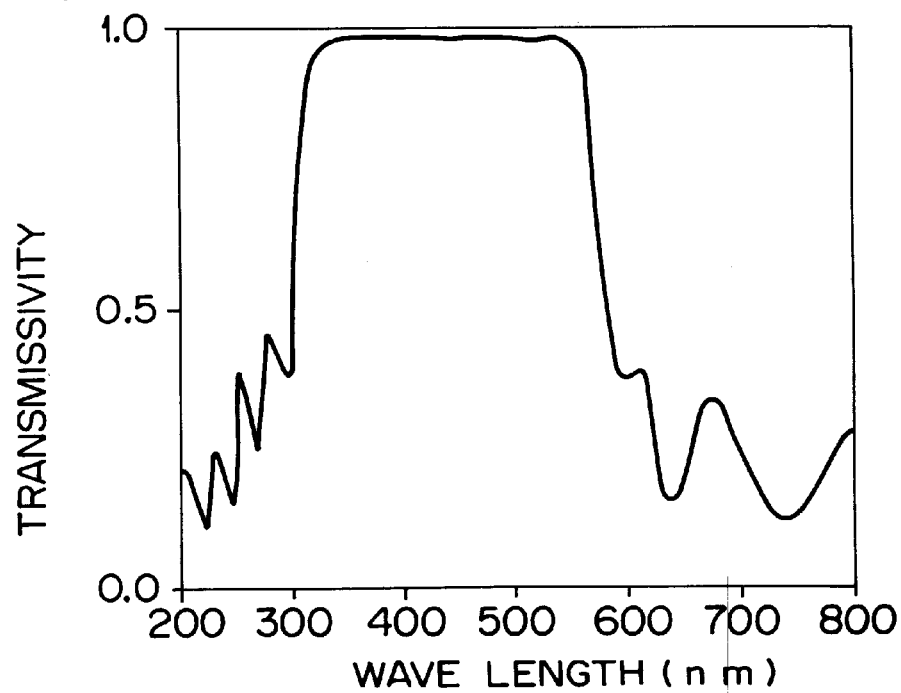
Figure 4:
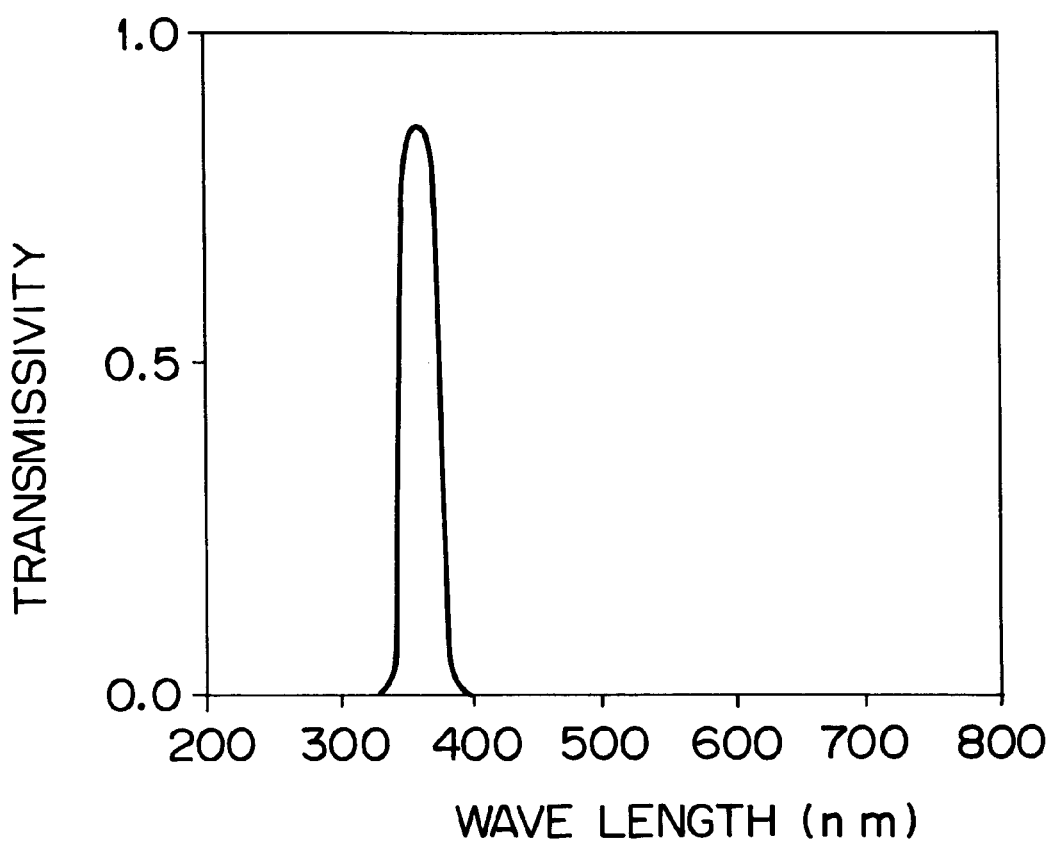
FIG. 4 is a graph showing the transmissivity of a conventional band-pass filter plate.

For example, in the conventional device shown in FIG. 1, the elliptical mirror 2A with the reflectance for light having a wavelength within the absorption band for ammonium sulfate reduced can simply be used instead of the conventional elliptical mirror 2 to prevent ammonium from adhering to optical elements (3, 4, 5) as well as the elliptical mirror 2. This is because the elliptical mirror 2A is hot because of light radiating from the mercury-arc lamp 1.

The mere reduction of wavelengths involved in clouding of the optical system that is a photochemical reaction cannot prevent this phenomenon completely. However, the use of wavelength control with a chemical filter as in the third embodiment can reduce clouding highly efficiently even in the environment that is not very chemically clean.

This invention is effective not only as an optical illumination device for a projection exposure apparatus but also as a similar device for a proximity or a contact exposure device.

When this invention is applied to a semiconductor exposure apparatus, it can be more effective if the apparatus is connected to a chamber to allow air to circulate because of reduced harmful ions. In addition, amine gas in the chamber is also reduced, resulting in a reduced reaction of amine gas with the chemically augmented resist-exposed section on a wafer during exposure. This prevents the phenomenon that the surface of the wafer becomes hard to melt and the patterns formed in the wafer becomes T-shaped, which phenomenon have been a problem in the field of chemically augmented positive resist.

Although the above embodiments have been described with reference to an exposure optical illumination system, this invention is also applicable to other optical illumination systems if the system suffers from clouding for a similar reason.

Of course, this invention is effective in optical systems using ultraviolet light. With this invention, various configurations are possible without deviation from the spirit of this invention.

The first optical illumination device in accordance with this invention can prevent ammonium sulfate or silicon oxide from adhering to optical systems, thereby reducing the clouding in such systems. A high illumination efficiency can thus be maintained even if the device has to be used in an environment that is not very chemically clean.

Ions such as ammonium $NH_4^+$ and sulfur $SiO_4^{2-}$ which cause clouding of optical members may be those that exist in air or those generated by direct ionization by irradiation of far-ultraviolet radiation, by ionization by generated ozones, or from black alumite in the retention element. The filter means in accordance with this invention adsorbs organic gases that may generate positive and negative ions and $NH_4^+$ in the air. Introducing air that has passed through this filter around the optical element can substantially reduce contamination within the device. If an attempt is made to take in only air subjected to this filtering and to avoid other gases, the ingress of harmful ions can be prevented to delay the progress of clouding in optical elements or members such as the elliptical mirrors 2, 2A, mirrors 3, 3a, collimator or input lens 4, and band-pass filter 5.

Use of an effective filter helps to solve problems that may be posed by a small amount of gases in the future. Since clean gases are supplied to almost all optical members subjected to clouding, almost all said members avoid this phenomenon.

In addition, the second optical illumination device can prevent clouding of optical members susceptible to this phenomenon. The supply of a chemically inactive gas further prevents clouding due to unwanted chemical reactions.

In the third optical illumination device, this invention reduces the reflectance of the light reflecting and condensing or converging element or member for light having a wavelength within the absorption band for sulfur dioxide. The quantity of white ammonium sulfate powder adhering to optical members subsequent to the light reflecting and condensing member can thus be reduced without a large heat source.

If the reflectance of the light reflecting and condensing member for light with at least one of the four wavelength bands of 105–180 nm, is made small 180–240 nm, 260–340 nm, and 340–390 nm is made small, the reflectance for light with a wavelength within the absorption band for sulfur dioxide can be reduced.

A mercury-arc lamp used as a discharge lamp emits little light with a wavelength band of 240 nm or less. Consequently, if the i-line (wavelength of 365 nm) is used as illumination light, the quantity of white ammonium sulfate powder adhering to optical elements disposed at the downstream side of the light from the light reflecting and condensing member can be substantially reduced simply by setting of the reflectance of the latter member or element to 0.5 or less for light with a wavelength of 260–340 nm.

If a light transmission element or member is located between the light reflection and condensing member and the optical illumination path and the transmissivity of the light transmission member for light having at least one of the four wavelength bands of 105–180 nm, 180–240 nm, 260–340 nm, and 340–390 nm is made small, the quantity of white ammonium sulfate powder adhering to optical elements or members positioned at the downstream side of light from the light transmission member can be substantially reduced.

If a reflecting member or mirror is located near the object illuminated by the light reflecting and condensing member in such a way that the former member deflects light via the latter and the reflectance of the reflecting member is set to 0.2 for light with a wavelength band of 260–340 nm, the amount of white ammonium sulfate powder adhering to optical member after the reflecting member can be substantially reduced.

Although, in the above embodiments, light with a long wavelength is guided to the reticle using the band-pass filter 5, light with a specified wavelength may be guided to the reticle.

The foregoing disclosure is the best mode devised by the inventors for practicing this invention. It is apparent, however, that an apparatus incorporating modifications and variations will be obvious to one skilled in the art of vehicle drive trains. Inasmuch as the foregoing disclosure is intended to enable one skilled in the pertinent art to practice the instant invention, it should not be construed to be limited thereby but should be construed to include such aforementioned obvious variations and be limited only by the spirit and scope of the following claims.

What is claimed is:

1. An illumination optical device comprising:
   a discharge lamp;
   a light reflecting and condensing member for reflecting and condensing light from said discharge lamp;
   a wavelength selection element for selecting light having a wavelength within a predetermined band from light reflected and condensed by said light reflecting and condensing member; and a removing member for removing at least one of organic compounds and ionic materials from gas flowing around a part or all of elements located within an optical path from said discharge lamp to said wavelength selection element;

wherein the reflectance of said reflecting and condensing member for light having a wavelength within the absorption band for sulfur dioxide is decreased.

2. An optical illumination device according to claim 1 further including:

a covering member covering almost all of an optical path from said discharge lamp to said wavelength selection element; and a gas supply system for allowing gas with a pressure higher than that of gas outside said covering member to pass into said covering member;

wherein said removing member removes at least one of organic compounds and ionic materials from the gas supplied within said covering member.

3. An optical illumination device according to claim 1 wherein said removing member includes ion exchange fiber and activated carbon or zeolites.

4. An optical illumination device according to claim 3 wherein said ion exchange fibers include acid cation exchange fibers and basic anion exchange fibers.

5. An optical illumination device according to claim 1 further including:

a temperature maintaining member for maintaining the temperature of the reflection surface of said light reflecting and condensing member at the decomposition temperature of ammonium sulfate.

6. An optical illumination device according to claim 1 wherein the reflectance of said light reflecting and condensing member for light having at least one of the four wavelength bands of 105–180 nm, 180–240 nm, 260–340 nm and 340–390 nm is decreased.

7. An optical illumination device according to claim 1 wherein the reflectance of said light reflecting and condensing member for the light having a wavelength band of 260–340 nm is set to 50% or less.

8. An optical illumination device according to claim 1 wherein a light transmission member is further located in the optical path between said light reflecting and condensing member and an object, the transmissivity of said light transmission member for light having at least one of the four wavelength bands of 105–180 nm, 180–240 nm, 260–340 nm and 340–390 nm being decreased.

9. An optical illumination device comprising:

a discharge lamp;

a light reflecting and condensing member for reflecting and condensing light from said discharge lamp;

a wavelength selection element for selecting light having a wavelength within a predetermined band for light reflected and condensed by said light reflecting and condensing member; and a gas blowing member for blowing gas, from which at least one of organic compounds and ionic materials has been removed by a removing member, against around at least one of elements located within an optical path from said discharge lamp to said wavelength selection element to isolate at least one of said elements from gases with impurities, said gas blowing member having injection ports opened to said elements.

10. An optical illumination device according to claim 9 wherein said gas blowing member is provided in a holder for at least one of said optical elements and has many injection ports that are open to an inner circumference of said holder and located apart in a circumferential direction of said holder.

11. An optical illumination device according to claim 9 wherein said removing member includes ion exchange fibers and activated carbon or zeolites.

12. An optical illumination device according to claim 11 wherein said ion exchange fibers include acid cation exchange fibers and basic anion exchange fibers.

13. An optical illumination device according to claim 9 wherein the reflectance of said light reflecting and condensing member for light having a wavelength within the absorption band for sulfur dioxide is decreased.

14. An optical illumination device according to claim 9 further including:

a temperature maintaining member for maintaining the temperature of the reflection surface of said light reflecting and condensing member at the decomposition temperature of ammonium sulfate.

15. An apparatus for exposing a photosensitive substrate with a pattern image on a mask comprising:

a discharge lamp; and a light reflecting and condensing member for reflecting and converging light from said discharge lamp and passing said light to said mask, wherein reflectance of said light reflecting and condensing member for light having a wavelength within an absorption band for sulfur dioxide is decreased.

16. An apparatus according to claim 15 wherein the reflectance of said light reflecting and condensing member for light having at least one of the four wavelength bands of 105–180 nm, 180–240 nm, 260–340 nm and 340–390 nm is decreased.

17. An apparatus according to claim 15 wherein the reflectance of said light reflecting and condensing member for light having the wavelength band of 260–340 nm is set to 50% or less.

18. An apparatus according to claim 15 wherein a light transmission member is further located in an optical illumination path between said reflecting and condensing member and said mask, the transmissivity of said light transmission element for light having at least one of the four wavelength bands of 105–180 nm, 180–240 nm, 260–340 nm and 340–390 nm being decreased.

19. An apparatus according to claim 15 wherein a light reflecting and deflecting member for reflecting and deflecting light from said light reflecting and condensing member to said mask is positioned at the downstream side for said light reflecting and deflecting member, the reflectance of said light reflecting and deflecting member for light having the wavelength band of 260–340 nm being set to 20% or less.

20. An apparatus according to clam 15 further including:

a temperature maintaining member for maintaining the temperature of the reflection surface of said light reflecting and condensing member at the decomposition temperature of ammonium sulfate.

21. An apparatus for exposing a photosensitive substrate with a pattern image on a mask comprising:

a discharge lamp;

a light reflecting and condensing member which reflects and condenses light from said discharge lamp;

a wavelength selecting member which selects light having a predetermined wavelength band from light reflected and condensed by said light reflecting and condensing member to transmit said light toward said mask; and an optical illumination device including at least one optical element which is located in an optical path between said light reflecting and condensing member and said wavelength selecting member, the transmissivity of said optical element for light having at least one of the four wavelength bands of 105–180 nm, 180–240 nm, 260–340 nm and 340–390 nm being decreased so that generation of ammonium sulfate is decreased.

22. An apparatus according to claim 21 further including:
a temperature maintaining member for maintaining the temperature of the reflection surface of said light reflecting and condensing member at the decomposition temperature of ammonium sulfate.

23. An apparatus for exposing a photosensitive substrate with a pattern image on a mask comprising:
a light source emitting light having at least a part of four wavelength bands of 105–180 nm, 180–240 nm, 260–340 nm and 340–390 nm;
a wavelength selecting member which selects light having a predetermined wavelength band from light emitted from said light source to transmit said light toward said mask; and
an optical system which illuminates said mask with light from the light source, said system including at least one optical element located in an optical path between said light source and said wavelength selecting member, said at least one optical element having one of transmissivity and reflectance, the transmissivity or reflectance of said at least one optical element for light having any wavelength included in said four wavelength bands among light from said light source being decreased so that generation of ammonium sulfate is decreased.

24. An apparatus according to claim 23, wherein said optical member is an elliptical mirror for reflecting and condensing light from said light source.

25. An exposure apparatus comprising:
a light source emitting light for illuminating a mask;
a wavelength selecting member which selects light having a predetermined wavelength band from light emitted from said light source to transmit said light toward said mask; and
an optical system including an optical element disposed between said light source and said wavelength selecting member, said optical element decreasing transmission of light having a wavelength band which contributes to generation of ammonium sulfate among light emitted by said light source.

26. An apparatus which illuminates an object comprising:
a light source emitting light for illuminating said object;
a wavelength selecting member which selects light having a predetermined wavelength band from light emitted from said light source to transmit said light toward said object; and
an optical system including a plurality of optical elements disposed between said light source and said wavelength selecting member, one of said optical elements decreasing transmission of light having a wavelength band which contributes to a chemical reaction caused in a light path of the optical system so that amount of products produced by said chemical reaction and attached to at least a part to said optical system are decreased.

27. An apparatus for exposing a photosensitive substrate with a pattern image on a mask comprising:
a discharge lamp;
a light reflecting and condensing member which reflects and condenses light from said discharge lamp to transmit said light toward said mask; and
an optical illumination device including at least one optical element which is located in an optical path between said light reflecting and condensing member and said mask, the transmissivity of said optical element for light having at least one of the wavelength bands of 105–180 nm, 360–390 nm being decreased so that generation of ammonium sulfate is decreased.

28. An exposure apparatus comprising:
a light source emitting light for illuminating a mask;
a light reflecting and condensing member which reflects and condenses light from said light source to transmit said light toward said mask; and
at least one optical element disposed in an optical path between said light source and said mask, said at least one optical element having one of transmissivity and reflectance, the transmissivity or reflectance of said optical element for light having a wavelength band which contributes to generation of ammonium sulfate and sensitization of a photosensitive substrate, among light emitted from said light source, being decreased.

29. An exposure apparatus which transfers an image of a pattern formed on a mask to an object comprising:
an illumination system including a light source emitting light for illuminating said mask and illuminating members which either one of reflect and transmit said light;
a wavelength selecting member disposed between said illumination system and said mask and selecting light having a predetermined wavelength band from said light to transmit selected light toward said mask; and
a clouding prevention member disposed in said illumination system and restraining formation of clouding caused in said illumination system by reducing light having a wavelength band which contributes to a photochemical reaction caused in said illumination system.

30. An exposure apparatus according to claim 29, wherein said clouding prevention member is provided on at least one of said illuminating members.

31. An exposure apparatus according to claim 30, wherein said clouding prevention member is provided on said illuminating member which reflects said light.

32. An exposure apparatus according to claim 31, wherein said illuminating member which reflects said light is a concave mirror.

33. An exposure apparatus according to claim 32, wherein said concave mirror includes a light reflecting and condensing member which condenses light emitted from said light source.

34. An exposure apparatus according to claim 31, wherein said illuminating member which reflects light is a plane mirror.

35. An exposure apparatus according to claim 30, wherein said clouding prevention member is provided on a light transmitting member.

36. An exposure apparatus according to claim 35, wherein said light transmitting member is movable into and out of a light path.

37. An exposure apparatus according to claim 30, further comprising a temperature controlling device which controls temperature of said illuminating member on which said clouding prevention member is provided.

38. An exposure apparatus according to claim 37, wherein said temperature controlling member heats said illuminating member at a temperature which is equal to or higher than the decomposition temperature at which material attached to said illuminating member by said photochemical reaction decomposes.

39. An exposure apparatus according to claim 38, wherein said decomposition temperature is 120° C.

40. An exposure apparatus according to claim 29, wherein said clouding prevention member is a multi-layer film provided on at least one of said illuminating members.

41. An exposure apparatus according to claim 30, wherein said clouding prevention member is provided on at least one of said illuminating members which directly receives light from said light source.

42. An exposure apparatus according to claim 29, wherein said illuminating members include a collimator lens, and wherein said wavelength selecting member selects light having said wavelength band from light collimated by said collimator lens.

* * * * *